(12) United States Patent
Kim

(10) Patent No.: US 12,185,581 B2
(45) Date of Patent: Dec. 31, 2024

(54) DISPLAY DEVICE INCLUDING BOTTOM SHIELD LAYER DISPOSED BETWEEN POLYIMIDE LAYER AND POLYCRYSTALLINE SEMICONDUCTOR LAYER

(71) Applicant: Samsung Display Co., Ltd., Yongin-Si (KR)

(72) Inventor: Keun Woo Kim, Seongnam-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 641 days.

(21) Appl. No.: 17/376,064

(22) Filed: Jul. 14, 2021

(65) Prior Publication Data

US 2022/0165824 A1 May 26, 2022

(30) Foreign Application Priority Data

Nov. 25, 2020 (KR) ........................ 10-2020-0159977

(51) Int. Cl.
*H10K 59/121* (2023.01)
*H10K 59/126* (2023.01)
*H10K 59/65* (2023.01)
*H10K 77/10* (2023.01)

(52) U.S. Cl.
CPC ....... *H10K 59/1213* (2023.02); *H10K 59/126* (2023.02); *H10K 59/65* (2023.02); *H10K 77/111* (2023.02)

(58) Field of Classification Search
CPC .. H10K 59/1213; H10K 59/126; H10K 59/65; H10K 77/111

USPC .......................................................... 257/40
See application file for complete search history.

(56) References Cited

U.S. PATENT DOCUMENTS

| | | | |
|---|---|---|---|
| 2002/0050795 A1* | 5/2002 | Imura | H01L 29/78633 315/169.3 |
| 2017/0084636 A1* | 3/2017 | Lin | H01L 27/1288 |
| 2017/0352711 A1* | 12/2017 | Zhang | H01L 27/1255 |
| 2021/0049958 A1 | 2/2021 | Kim et al. | |
| 2021/0074736 A1* | 3/2021 | Hanada | G02F 1/134372 |
| 2021/0098549 A1* | 4/2021 | Zhang | H10K 50/844 |
| 2021/0202621 A1* | 7/2021 | Liang | H10K 59/1216 |
| 2021/0202645 A1* | 7/2021 | Kim | H10K 59/88 |
| 2021/0328071 A1* | 10/2021 | Liu | H10K 59/126 |
| 2023/0013848 A1* | 1/2023 | Shi | H10K 59/1213 |

FOREIGN PATENT DOCUMENTS

| | | |
|---|---|---|
| JP | 5874804 B2 | 3/2016 |
| KR | 10-0742494 B1 | 7/2007 |
| KR | 10-2019-0115166 A | 10/2019 |
| KR | 10-2020-0029081 A | 3/2020 |

\* cited by examiner

*Primary Examiner* — Matthew E. Gordon
(74) *Attorney, Agent, or Firm* — Innovation Counsel LLP

(57) ABSTRACT

An embodiment of a display device includes a flexible substrate including a polyimide layer and a barrier layer disposed on the polyimide layer. A driving transistor and a second transistor are disposed on the flexible substrate and include a polycrystalline semiconductor layer. A third transistor is disposed on the flexible substrate and includes an oxide semiconductor layer. A light emitting diode is electrically connected to the driving transistor. A bottom shield layer is disposed between the polyimide layer and the polycrystalline semiconductor layer in a cross-sectional view and disposed around a channel of the driving transistor in a plan view.

20 Claims, 18 Drawing Sheets

DISPLAY DEVICE INCLUDING BOTTOM SHIELD LAYER DISPOSED BETWEEN POLYIMIDE LAYER AND POLYCRYSTALLINE SEMICONDUCTOR LAYER

CROSS-REFERENCE TO RELATED APPLICATION

This application claims priority to and the benefit of Korean Patent Application No. 10-2020-0159977 filed in the Korean Intellectual Property Office on Nov. 25, 2020, the entire contents of which are incorporated herein by reference.

BACKGROUND

1. Field

The present disclosure relates to a display device, and more specifically, to a display device including a light emitting diode.

2. Description of the Related Art

A display device is a device for displaying an image, and includes a liquid crystal display (LCD), an organic light emitting diode (OLED) display, and the like. The display device is used in various electronic devices such as a mobile phone, a navigation device, a digital camera, an electronic book, a portable game machine, and various terminals.

Since the OLED display has a self-luminance characteristic and does not require a separate light source, unlike the LCD, thickness and weight thereof may be reduced. In addition, the OLED display has high-quality characteristics such as low power consumption, high luminance, and high response speed.

Recently, the OLED display is formed on a plastic substrate to have a flexible structure.

The above information disclosed in this Background section is only for enhancement of understanding of the background of the described technology, and therefore it may contain information that does not form the prior art that is already known in this country to a person of ordinary skill in the art.

SUMMARY

An embodiment provides a display device including: a flexible substrate including a polyimide layer and a barrier layer disposed on the polyimide layer; a driving transistor and a second transistor disposed on the flexible substrate and including a polycrystalline semiconductor layer; a third transistor disposed on the flexible substrate and including an oxide semiconductor layer; a light emitting diode electrically connected to the driving transistor; and a bottom shield layer disposed between the polyimide layer and the polycrystalline semiconductor layer in a cross-sectional view and disposed around a channel of the driving transistor in a plan view.

A middle portion of the bottom shield layer may include an opening.

The bottom shield layer may include an extension connected to an adjacent bottom shield layer.

The driving transistor may further include a gate electrode, and the gate electrode of the driving transistor may partially overlap the bottom shield layer in a plan view.

The driving transistor may further include a gate electrode, and the gate electrode of the driving transistor may not overlap the bottom shield layer in a plan view.

The display device may further include a buffer layer disposed between the substrate and the polycrystalline semiconductor layer, wherein the bottom shield layer may be disposed on the substrate and is covered with the buffer layer.

The bottom shield layer may further include a second bottom shield layer that is disposed on the polyimide layer and is covered by the barrier layer.

The bottom shield layer may be disposed on the polyimide layer and is covered by the barrier layer.

The substrate may include two polyimide layers and two barrier layers.

The display device may further include a rear passivation layer disposed on a rear surface of the substrate and including an opening, wherein one pixel including the driving transistor, the second transistor, the third transistor, the light emitting diode, and the bottom shield layer may be formed at a position corresponding to the opening of the rear passivation layer on the substrate.

A fingerprint sensing sensor may be disposed in the opening of the rear passivation layer.

A camera or an optical element may be disposed in the opening of the rear passivation layer.

Another embodiment provides a display device including: a substrate including a polyimide layer and a barrier layer; a polycrystalline semiconductor layer disposed on the substrate and including a channel of a driving transistor; a first gate insulation film disposed on the polycrystalline semiconductor layer; a gate electrode of the driving transistor that is disposed on the first gate insulation film and overlaps the channel of the driving transistor; a first electrode of a boost capacitor disposed on the first gate insulation film; a second gate insulation film disposed on the driving gate electrode and the first electrode of the boost capacitor; a first interlayer insulation film disposed on the second gate insulation film; an oxide semiconductor disposed on the first interlayer insulation film and including a channel of a third transistor, a channel of a fourth transistor, and a second electrode of the boost capacitor; a third gate insulation film disposed on the oxide semiconductor; a gate electrode of the third transistor disposed on the third gate insulation film and overlapping the channel of the third transistor; a gate electrode of the fourth transistor disposed on the third gate insulation film and overlapping the channel of the fourth transistor; a second interlayer insulation film disposed on the gate electrode of the third transistor and the gate electrode of the fourth transistor; and a bottom shield layer disposed between the polyimide layer and the polycrystalline semiconductor layer.

The gate electrode of the driving transistor may partially overlap the bottom shield layer in a plan view.

The gate electrode of the driving transistor may not overlap the bottom shield layer in a plan view.

The display device may further include a buffer layer disposed between the substrate and the polycrystalline semiconductor layer, wherein the bottom shield layer may be disposed on the substrate and may be covered with the buffer layer.

The bottom shield layer may further include a second bottom shield layer that is disposed on the polyimide layer and is covered by the barrier layer.

The bottom shield layer may be disposed on the polyimide layer and may be covered by the barrier layer.

The substrate may include two polyimide layers and two barrier layers.

The display device may further include a rear passivation layer disposed on a rear surface of the substrate and including an opening, wherein one pixel including the driving transistor, the second transistor, the third transistor, the fourth transistor, the boost capacitor, and the bottom shield layer may be formed at a position corresponding to the opening of the rear passivation layer on the substrate.

According to the embodiments, a bottom shield layer is disposed around a driving transistor of a pixel and is disposed between a substrate and the driving transistor in a cross-sectional view, so that characteristics of the driving transistor of the pixel are not changed due to light or polarity caused by a flexible substrate.

DETAILED DESCRIPTION

Figure 1:
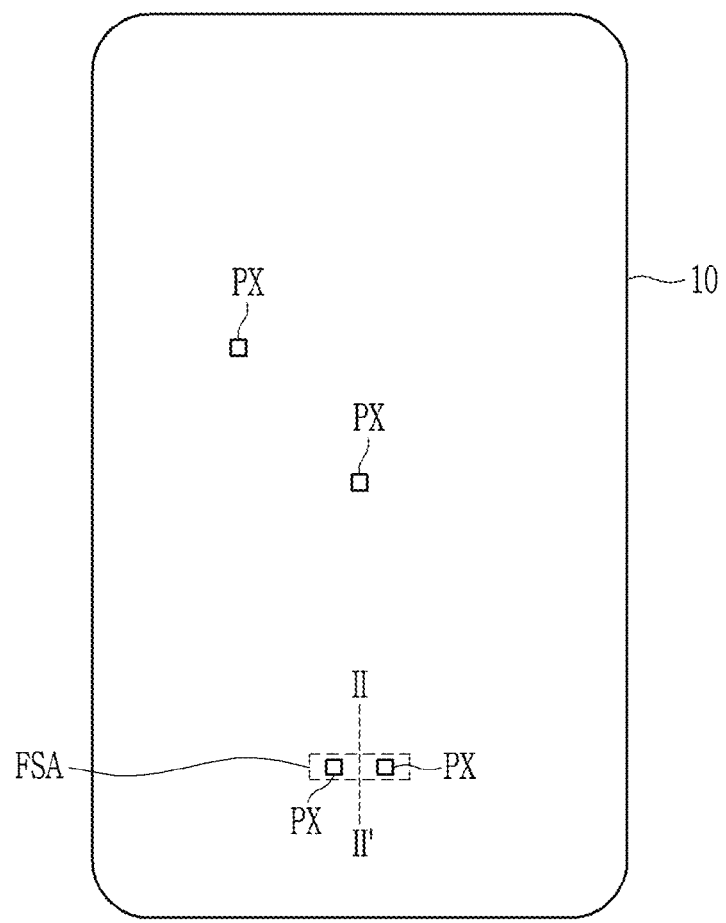
FIG. 1 illustrates a schematic top plan view of a display device according to an embodiment.

One or more embodiments of a display device disclosed herein reduce a change in a characteristic of a driving transistor of a pixel due to light.

The present invention will be described more fully hereinafter with reference to the accompanying drawings, in which embodiments of the invention are shown. As those skilled in the art would realize, the described embodiment may be modified in various different ways, all without departing from the spirit or scope of the present.

In order to clearly describe the present invention, parts that are irrelevant to the description are omitted, and identical or similar constituent elements throughout the specification are denoted by the same reference numerals.

Further, in the drawings, the size and thickness of each element are arbitrarily illustrated for ease of description, and the present disclosure is not necessarily limited to those illustrated in the drawings. In the drawings, the thicknesses of layers, films, panels, regions, areas etc., are exaggerated for clarity. In the drawings, for ease of description, the thicknesses of some layers and areas are exaggerated.

It will be understood that when an element such as a layer, film, region, area, or substrate is referred to as being "on" another element, it can be directly on the other element or intervening elements may also be present. In contrast, when an element is referred to as being "directly on" another element, there are no intervening elements present. Further, in the specification, the word "on" or "above" means positioned on or below the object portion, and does not necessarily mean positioned on the upper side of the object portion based on a gravitational direction.

In addition, unless explicitly described to the contrary, the word "comprise" and variations such as "comprises" or "comprising" will be understood to imply the inclusion of stated elements but not the exclusion of any other elements.

Further, throughout the specification, the phrase "in a plan view" or "on a plane" means viewing a target portion from the top, and the phrase "in a cross-sectional view" or "on a cross-section" means viewing a cross-section formed by vertically cutting a target portion from the side.

A structure of a display device according to an embodiment to which the present invention may be applied will be described with reference to FIG. 1 and FIG. 2.

Figure 2:
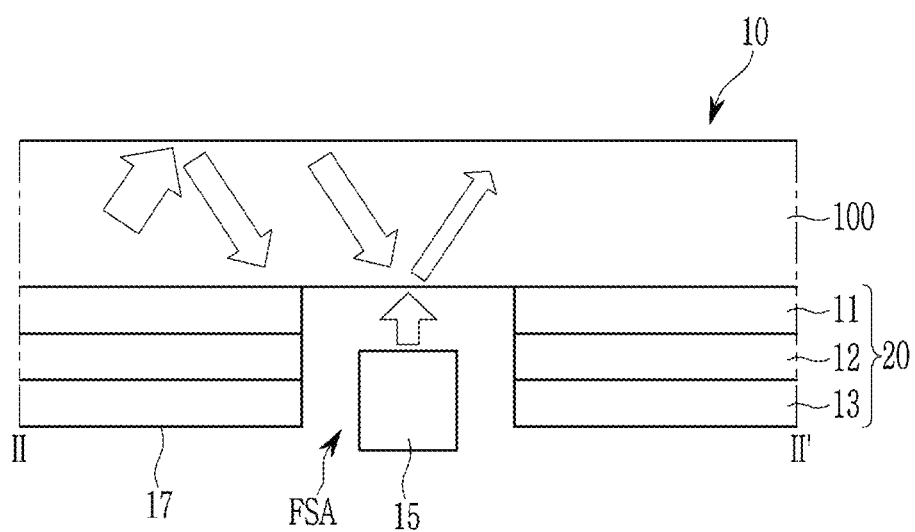
FIG. 2 illustrates a cross-sectional view of the display device taken along line II-II' of FIG. 1.

FIG. 1 illustrates a schematic top plan view of a display device according to an embodiment, and FIG. 2 illustrates a cross-sectional view of the display device taken along line II-II' of FIG. 1.

In FIG. 1, a display device 10 includes pixels PX and an opening FSA. In FIG. 2, the display device 10 includes a display panel 100, a rear passivation layer 20 including the opening FSA, and a sensor 15.

The rear passivation layer 20 includes black tape 11, a cushion layer 12, and a metal layer 13. The black tape 11 serves to block light from entering the display panel 100 from a rear surface 17, and the cushion layer 12 prevents an impact from the rear surface 17 from being transmitted to the display panel 100. In addition, the metal layer 13 allows the display panel 100 to maintain a bent state when it is bent due to its flexible characteristic, and may be made of a metal such as copper (Cu) that may be easily bent.

The sensor 15 is disposed in the opening FSA of the rear passivation layer 20.

The sensor 15 used in the present embodiment is a sensor that senses a user's finger on a front surface of the display panel 100, and in the following embodiment, a fingerprint sensor will be described as an example.

In the present embodiment, the reason the sensor 15 is disposed in the opening FSA of the rear passivation layer 20 is to sense the user's finger on the front surface of the display panel 100. The sensor 15 senses the user's finger through the opening FSA of the rear passivation layer 20, and a double-sided adhesive tape and/or resin layer is further formed to attach the sensor 15 so that it is disposed around the opening FSA of the rear passivation layer 20.

The display panel 100 according to the embodiment uses an organic light emitting display panel having a flexible characteristic. That is, a separate light unit is not included, a self-luminance organic light emitting layer is included, and a pixel is formed on a flexible substrate including a material such as a polyimide.

The organic light emitting display panel 100 includes a plurality of pixels PX, and one pixel PX includes a pixel circuit and a light emitting element.

The pixel circuit applies a current to the light emitting element based on a signal applied from the outside, and the light emitting element is disposed at an upper portion of the pixel circuit and includes an organic light emitting layer and a pair of electrodes (an anode and a cathode) positioned at respective sides of the organic light emitting layer. A current outputted by the pixel circuit flows through the organic light emitting layer, and a degree to which the organic light emitting element emits light varies according to an amount of the current.

The organic light emitting element includes an organic light emitting material, and when the organic light emitting material is combined with moisture, efficiency of the organic light emitting element is degraded. Accordingly, side and upper surfaces of the pixel circuit and the light emitting element are sealed with an encapsulation layer to prevent moisture from penetrating from the outside. The encapsulation layer may have a structure including a plurality of layers of an organic layer and an inorganic layer, and may include a triple layer structure of an inorganic layer, an organic layer, and an inorganic layer.

In some embodiments, a touch sensing part (not shown) capable of sensing a touch may be included at the inside of the display panel 100 or at an upper side of the display panel 100. That is, a sensing electrode capable of sensing a touch may be further formed on the encapsulation layer of the display panel 100, or a separate touch sensing substrate may be disposed on the upper portion of the display panel 100.

Hereinafter, a pixel PX formed in the display panel 100 according to the present embodiment will be described in detail with reference to FIG. 3 to FIG. 5, and the pixel PX of FIG. 3 to FIG. 5 may be disposed at a portion corresponding to the opening FSA of the rear passivation layer 20 of the display panel 100.

First, the pixel PX will be described with reference to FIG. 3.

Figure 3:
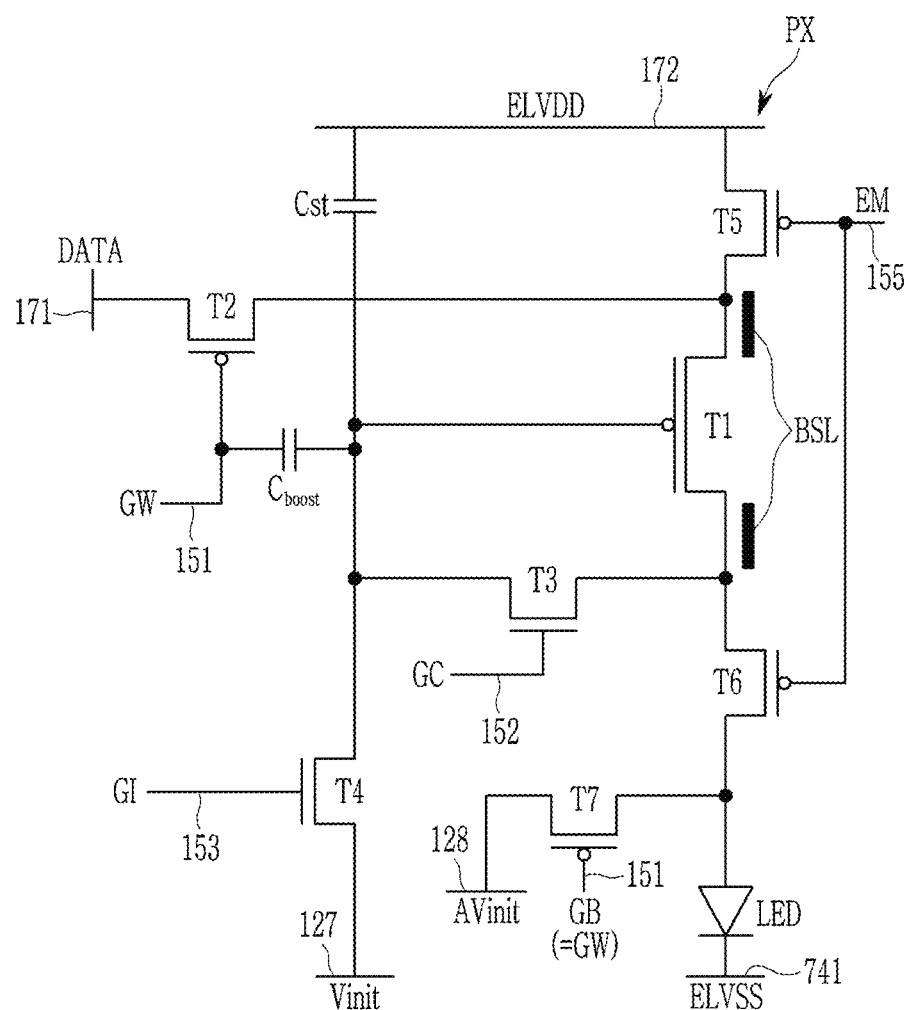
FIG. 3 illustrates a circuit diagram of one pixel included in a display device according to an embodiment.

FIG. 3 illustrates schematically an embodiment of the pixel PX including the pixel circuit and the light emitting element.

The pixel PX includes transistors T1, T2, T3, T4, T5, T6, and T7, a storage capacitor Cst, a boost capacitor $C_{boost}$, and a light emitting diode LED, connected to a plurality of wires 127, 128, 151, 152, 153, 155, 171, 172, and 741. Here, the light emitting element is a light emitting diode LED; and the transistors, the capacitors, and the wires form the pixel circuit.

The plurality of wires includes a first initialization voltage line 127, a second initialization voltage line 128, a first scan line 151, a second scan line 152, an initialization control line 153, a light emission control line 155, a data line 171, a driving voltage line 172, and a common voltage line 741. In the embodiment of FIG. 3, the first scan line 151 connected to the seventh transistor T7 is also connected to the second transistor T2, but in some embodiments, the seventh transistor T7, unlike the second transistor T2, may be connected to a bypass control line.

The first scan line 151 is connected to a gate driver (not shown) to transmit a first scan signal GW to the second transistor T2 and the seventh transistor T7. The second scan line 152 may be applied with a voltage of an opposite polarity to a voltage applied to the first scan line 151 at the same timing as that of a signal of the first scan line 151. For example, when a negative voltage is applied to the first scan line 151, a positive voltage may be applied to the second scan line 152. The second scan line 152 transmits a second scan signal GC to the third transistor T3. The initialization control line 153 transmits an initialization control signal GI to the fourth transistor T4. The light emission control line 155 transmits a light emission control signal EM to the fifth transistor T5 and the sixth transistor T6.

The data line 171 is a line that transmits a data voltage DATA generated by a data driver (not shown), and thus, as an amount of a current transmitted to the light emitting diode LED is changed, and luminance emitted by the light emitting diode LED is also changed. The driving voltage line 172 applies a driving voltage ELVDD. The first initialization voltage line 127 transmits a first initialization voltage Vinit, and the second initialization voltage line 128 transmits a second initialization voltage AVinit. The common voltage line 741 applies a common voltage ELVSS to a cathode of the light emitting diode LED. In the present embodiment, each of voltages applied to the driving voltage line 172, the first and second initialization voltage lines 127 and 128, and the common voltage line 741 may be a constant voltage.

The driving transistor T1 (also referred to as the first transistor) is a p-type transistor, and has a polycrystalline semiconductor as a semiconductor layer. It is a transistor that adjusts the amount of current outputted to the anode of the light emitting diode LED according to a voltage (that is, a voltage stored in the storage capacitor Cst) of a gate electrode of the driving transistor T1. Since brightness of the light emitting diode LED is adjusted according to an amount of a driving current outputted to the anode electrode of the light emitting diode LED, light emission luminance of the light emitting diode LED may be adjusted according to the data voltage DATA applied to the pixel. For this purpose, a first electrode of the driving transistor T1 is disposed to receive the driving voltage ELVDD, and is connected to the driving voltage line 172 via the fifth transistor T5. In addition, the first electrode of the driving transistor T1 is connected to a second electrode of the second transistor T2 to receive the data voltage DATA. Meanwhile, a second electrode of the driving transistor T1 outputs a current to the light emitting diode LED, and is connected to the anode of the light emitting diode LED via the sixth transistor T6. In addition, the second electrode of the driving transistor T1 is also connected to the third transistor T3 to transmit the data voltage DATA applied to the first electrode thereof to the third transistor T3. Meanwhile, a gate electrode of the driving transistor T1 is connected to one electrode of the storage capacitor Cst (hereinafter referred to as a 'second storage electrode'). A voltage of the gate electrode of the driving transistor T1 is changed according to a voltage stored in the storage capacitor Cst, and accordingly, a driving current outputted from the driving transistor T1 is changed. In addition, the storage capacitor Cst serves to maintain the voltage of the gate electrode of the driving transistor T1 constant for one frame.

Referring to FIG. 3, a bottom shield layer BSL floating around the driving transistor T1 is formed, and the bottom shield layer BSL is formed between the driving transistor T1 and the fifth transistor T5 and sixth transistor T6. The bottom shield layer BSL is made of various types of metals such as molybdenum (Mo) and titanium (Ti) by a sputtering process. In addition, in some embodiments, the bottom shield layer BSL may be formed as a semiconductor layer by a chemical vapor deposition (CVD) method, or may be formed with n+ or p+ impurities by a doping process in the semiconductor layer. In some embodiments, the bottom shield layer BSL may be applied with a voltage, and may be applied with a constant voltage such as the driving voltage ELVDD, or may be connected to one electrode (for example, the first electrode or second electrode of the driving transistor T1) of one transistor to receive a voltage. A detailed structure of the bottom shield layer BSL will be described in detail in FIG. 4.

The second transistor T2 is a p-type transistor, and has a polycrystalline semiconductor as a semiconductor layer. The second transistor T2 is a transistor that allows the data voltage DATA to be received into the pixel. A gate electrode of the second transistor T2 is connected to the first scan line 151 and one electrode of the boost capacitor $C_{boost}$ (hereinafter referred to as a 'lower boost electrode'). A first electrode of the second transistor T2 is connected to the data line 171. A second electrode of the second transistor T2 is connected to the first electrode of the driving transistor T1. When the second transistor T2 is turned on by a negative voltage of the first scan signal GW transmitted through the first scan line 151, the data voltage DATA transmitted through the data line 171 is transmitted to the first electrode of the driving transistor T1.

The third transistor T3 is an n-type transistor, and has an oxide semiconductor as a semiconductor layer. The third transistor T3 electrically connects the second electrode of the driving transistor T1 and the gate electrode of the driving transistor T1. As a result, it is a transistor that allows a compensation voltage that is changed as the data voltage DATA passes through the driving transistor T1 to be stored in the second storage electrode of the storage capacitor Cst. A gate electrode of the third transistor T3 is connected to the second scan line 152, and a first electrode of the third transistor T3 is connected to the second electrode of the driving transistor T1. A second electrode of the third transistor T3 is connected to the second storage electrode of the storage capacitor Cst, the gate electrode of the driving transistor T1, and the other electrode of the boost capacitor $C_{boost}$ (hereinafter referred to as an 'upper boost electrode'). The third transistor T3 is turned on by a positive voltage of the second scan signal GC transmitted through the second scan line 152 to connect the gate electrode of the driving transistor T1 and the second electrode of the driving transistor T1, and to allow a voltage applied to the gate electrode of the driving transistor T1 to be transmitted to the second storage electrode of the storage capacitor Cst to be stored in the storage capacitor Cst. In this case, the voltage stored in the storage capacitor Cst is stored in a state in which the voltage of the gate electrode of the driving transistor T1 when the driving transistor T1 is turned off is stored and a threshold voltage (Vth) of the driving transistor T1 is compensated.

The fourth transistor T4 is an n-type transistor, and has an oxide semiconductor as a semiconductor layer. The fourth transistor T4 serves to initialize the gate electrode of the driving transistor T1 and the second storage electrode of the storage capacitor Cst. A gate electrode of the fourth transistor T4 is connected to the initialization control line 153, and a first electrode of the fourth transistor T4 is connected to the first initialization voltage line 127. A second electrode of the fourth transistor T4 is connected to the second electrode of the third transistor T3, the second storage electrode of the storage capacitor Cst, the gate electrode of the driving transistor T1, and the upper boost electrode of the boost capacitor $C_{boost}$. The fourth transistor T4 is turned on by a positive voltage of the initialization control signal GI received through the initialization control line 153, and at this time, it transmits the first initialization voltage Vinit to the gate electrode of the driving transistor T1, the second storage electrode of the storage capacitor Cst, and the upper boost electrode of the boost capacitor $C_{boost}$ to initialize them.

The fifth transistor T5 and the sixth transistor T6 are p-type transistors, and have polycrystalline semiconductors as a semiconductor layer.

The fifth transistor T5 serves to transmit the driving voltage ELVDD to the driving transistor T1. A gate electrode of the fifth transistor T5 is connected to the light emission control line 155, a first electrode of the fifth transistor T5 is connected to the driving voltage line 172, and a second electrode of the fifth transistor T5 is connected to the first electrode of the driving transistor T1.

The sixth transistor T6 serves to transmit a current outputted from the driving transistor T1 to the light emitting diode LED. A gate electrode of the sixth transistor T6 is connected to the light emission control line 155, a first electrode of the sixth transistor T6 is connected to the second electrode of the driving transistor T1, and a second electrode of the sixth transistor T6 is connected to the anode of the light emitting diode LED.

The seventh transistor T7 is a p-type transistor, and has a polycrystalline semiconductor as a semiconductor layer. The seventh transistor T7 serves to initialize the anode of the light emitting diode LED. A gate electrode of the seventh transistor T7 is connected to the first scan line 151, a first electrode of the seventh transistor T7 is connected to the anode of the light emitting diode LED, and a second electrode of the seventh transistor T7 is connected to the second initialization voltage line 128. When the seventh transistor T7 is turned on by a negative voltage of the first scan line 151, the second initialization voltage AVint is applied to the anode of the light emitting diode LED to initialize it. Meanwhile, the gate electrode of the seventh transistor T7 may be connected to a separate bypass control line, and may separately control it from the first scan line 151. In addition, in some embodiments, the second initialization voltage line 128 to which the second initialization voltage AVinit is applied may be the same as the first initialization voltage line 127 to which the first initialization voltage Vinit is applied.

The embodiment of the pixel PX shown in FIG. 3 includes the seven transistors T1 to T7 and two capacitors (the storage capacitor Cst and the boost capacitor $C_{boost}$), but the present invention is not limited thereto, and some transistors and capacitors may be removed or added.

Hereinafter, a disposition and cross-sectional structure of the pixel according to the embodiment having the circuit structure of FIG. 3 will be described with reference to FIG. 4 and FIG. 5.

Figure 4:
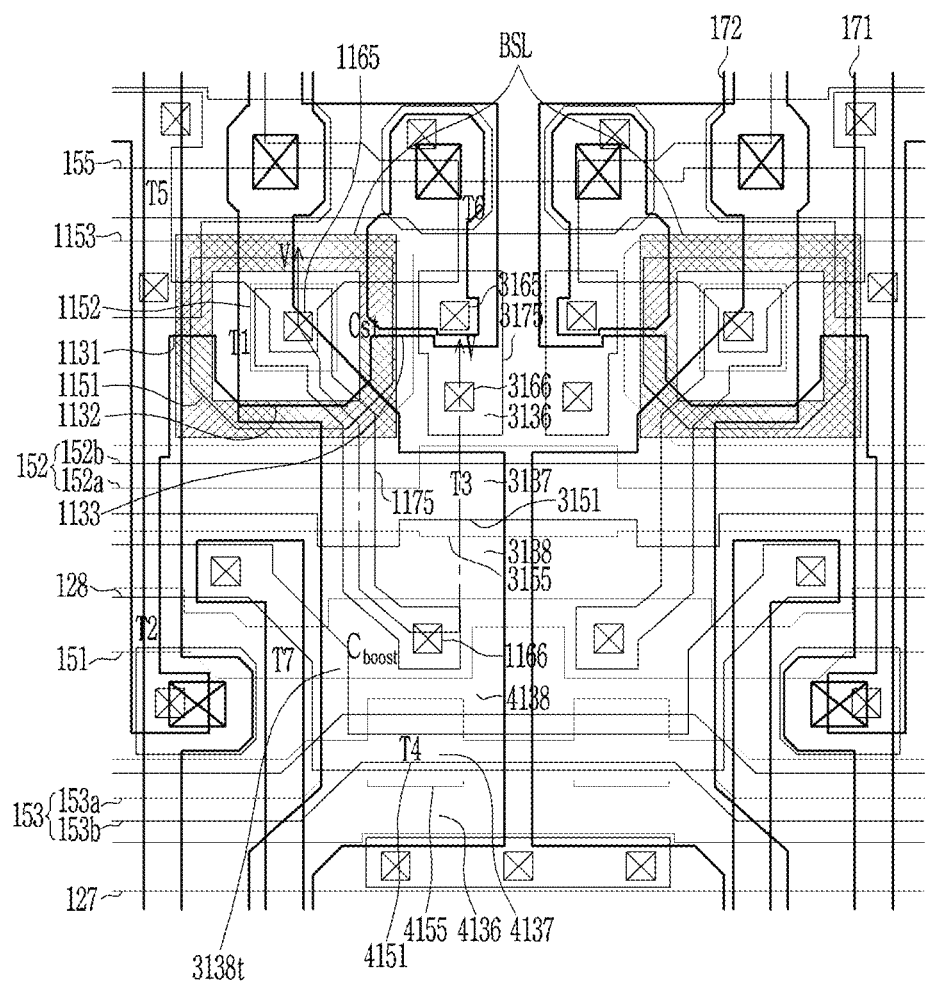
FIG. 4 illustrates a layout view of a pixel according to an embodiment.
Figure 5:
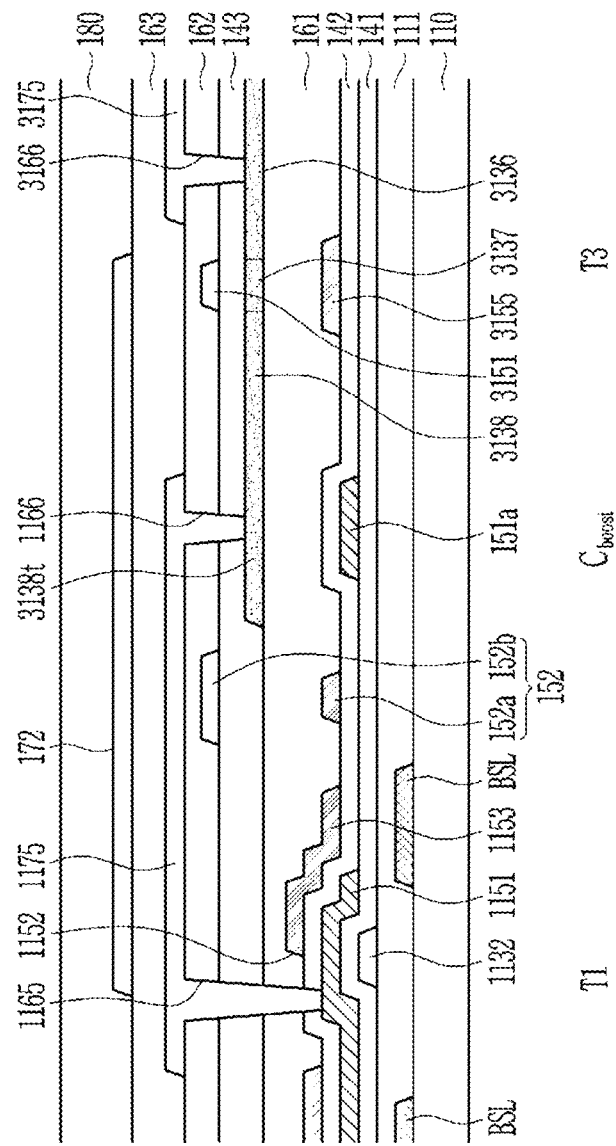
FIG. 5 illustrates a cross-sectional view taken along line V-V of FIG. 4.

FIG. 4 illustrates a layout view of a pixel according to an embodiment, and FIG. 5 illustrates a cross-sectional view taken along line V-V of FIG. 4.

The bottom shield layer BSL is formed on the flexible substrate 110 to float around the driving transistor T1. More specifically, the bottom shield layer BSL is formed around an area in which a channel of the driving transistor T1 will be disposed, and the bottom shield layer BSL is mainly formed between the driving transistor T1 and the fifth transistor T5 and between the driving transistor T1 and the sixth transistor T6.

In addition, in order to block light incident on the channel of the driving transistor T1 from the side, in the embodiment of FIG. 4, a bottom shield layer BSL of a rectangular shape having a rectangular opening surrounding the channel of the driving transistor T1 is formed. The bottom shield layer BSL has a structure overlapping a portion of the gate electrode of the driving transistor T1 in a plan view.

According to the bottom shield layer BSL having the structure as shown in FIG. 4, the pixel is formed at a position corresponding to the opening FSA in the rear passivation layer 20, so that even when the light is transmitted from the outside, light is blocked by the bottom shield layer BSL disposed under the channel of the driving transistor T1. Accordingly, the characteristic of the channel of the driving transistor T1 is not changed by light.

The buffer layer 111 is disposed on the substrate 110 and the bottom shield layer BSL, and a polycrystalline semiconductor layer including a channel 1132, a first area 1131, and a second area 1133 of the driving transistor T1 are disposed on the buffer layer 111. The polycrystalline semiconductor layer includes not only the channel of the driving transistor T1 but also the channels of the second transistor T2, the fifth transistor T5, the sixth transistor T6, and the seventh transistor T7, and respective sides of each channel have areas having conductive layer characteristics formed by plasma treatment or doping to serve as first electrodes and second electrodes. A buffer layer 111 may include an inorganic insulation material such as a silicon nitride (SiNx), a silicon oxide (SiOx), and a silicon oxynitride (SiOxNy).

A channel 1132 of the driving transistor T1 may have a curved shape in a plan view. However, the shape of the channel 1132 of the driving transistor T1 is not limited thereto, and may be variously changed. For example, the channel 1132 of the driving transistor T1 may be bent in a different shape, or may be formed in a rod shape. A first area 1131 and a second area 1133 of the driving transistor T1 may be disposed at respective sides of the channel 1132 of the driving transistor T1. The first area 1131 and the second area 1133 disposed at the polycrystalline semiconductor layer serve as the first electrode and the second electrode of the driving transistor T1. The first area 1131 of the driving transistor T1 extends upward and downward in FIG. 4, the portion extending downward is connected to the second electrode of the second transistor T2, and the portion extending upward is connected to the second electrode of the fifth transistor T5. The second area 1133 of the driving transistor T1 extends upward in a plan view to be connected to the first electrode of the sixth transistor T6, and it extends downward to be connected to the third transistor T3.

A first gate insulation film 141 may be disposed on the polycrystalline semiconductor layer including the channel 1132, the first area 1131, and the second area 1133 of the driving transistor T1. The first gate insulation film 141 may include an inorganic insulation material such as a silicon nitride (SiNx), a silicon oxide (SiOx), and a silicon oxynitride (SiOxNy).

A first gate conductive layer including a gate electrode 1151 of the driving transistor T1 may be disposed on the first gate insulation film 141. The first gate conductive layer includes the gate electrode of each of the driving transistor T1, the second transistor T2, the fifth transistor T5, the sixth transistor T6, and the seventh transistor T7, and a lower boost electrode 151a of the boost capacitor $C_{boost}$. The gate electrode 1151 of the driving transistor T1 may overlap the channel 1132 of the driving transistor T1. The channel 1132 of the driving transistor T1 is covered by the gate electrode 1151 of the driving transistor T1.

The first gate conductive layer may further include the first scan line 151 and the light emission control line 155. The first scan line 151 and the light emission control line 155 may substantially extend in a horizontal direction. The first scan line 151 may be connected to the gate electrode of the second transistor T2. The first scan line 151 may be integrated with the gate electrode of the second transistor T2. The first scan line 151 is connected to the gate electrode of the seventh transistor T7, and the gate electrode of the fifth transistor T5 and the gate electrode of the sixth transistor T6 are connected to the light emission control line 155.

After the first gate conductive layer including the gate electrode 1151 of the driving transistor T1 is formed, the exposed area of the polycrystalline semiconductor layer may be made conductive by performing a plasma treatment or a doping process. That is, the polycrystalline semiconductor layer covered by the first gate conductive layer is not conductive, and a portion of the polycrystalline semiconductor layer that is not covered by the first gate conductive layer may have the same characteristic as the conductive layer. As a result, the transistor including the conductive portion has a p-type transistor characteristic, so that the driving transistor T1, the second transistor T2, the fifth transistor T5, the sixth transistor T6, and the seventh transistor T7 may be p-type transistors.

A second gate insulation film 142 may be disposed on the first gate conductive layer and the first gate insulation film 141 including the gate electrode 1151 of the driving transistor T1. The second gate insulation film 142 may include an inorganic insulation material such as a silicon nitride (SiNx), a silicon oxide (SiOx), and a silicon oxynitride (SiOxNy).

A second gate conductive layer including a first storage electrode 1153 of the storage capacitor Cst, a light blocking layer 3155 of the third transistor T3, and a light blocking layer 4155 of the fourth transistor T4 may be disposed on the second gate insulation film 142. According to the light blocking layer 3155 of the third transistor T3 and the light blocking layer 4155 of the fourth transistor T4, even if the pixel is disposed in the opening FSA, the characteristics of the third transistor T3 and the fourth transistor T4 are not changed by light.

The first storage electrode 1153 overlaps the gate electrode 1151 of the driving transistor T1 to form the storage capacitor Cst. An opening 1152 is formed in the first storage electrode 1153 of the storage capacitor Cst. The opening 1152 of the first storage electrode 1153 of the storage capacitor Cst may overlap the gate electrode 1151 of the driving transistor T1. The light blocking layer 3155 of the third transistor T3 may overlap a channel 3137 and a gate electrode 3151 of the third transistor T3. The light blocking layer 4155 of the fourth transistor T4 may overlap a channel 4137 and a gate electrode 4151 of the fourth transistor T4.

The second gate conductive layer may further include a lower second scan line 152a, a lower initialization control line 153a, and a first initialization voltage line 127. The lower second scan line 152a, the lower initialization control line 153a, and the first initialization voltage line 127 may substantially extend in a horizontal direction. The lower second scan line 152a may be connected to the light blocking layer 3155 of the third transistor T3. The lower second scan line 152a may be integrally formed with the light blocking layer 3155 of the third transistor T3. The lower initialization control line 153a may be connected to the light blocking layer 4155 of the fourth transistor T4. The lower initialization control line 153a may be integrally formed with the light blocking layer 4155 of the fourth transistor T4.

A first interlayer insulation film 161 may be disposed on the second gate conductive layer including the first storage electrode 1153 of the storage capacitor Cst, the light blocking layer 3155 of the third transistor T3, and the light blocking layer 4155 of the fourth transistor T4. The first interlayer insulation film 161 may include an inorganic insulation material such as a silicon nitride (SiNx), a silicon oxide (SiOx), and a silicon oxynitride (SiOxNy), and in some embodiments, the inorganic insulation material may be thickly formed therein. However, in some embodiments, it may also include an organic material.

An oxide semiconductor layer including the channel 3137, a first area 3136, and a second area 3138 of the third transistor T3, and the channel 4137, a first area 4136, and a second area 4138 of the fourth transistor T4 may be disposed on the first interlayer insulation film 161. In addition, the oxide semiconductor layer may include an upper boost electrode 3138t of the capacitor $C_{boost}$.

The channel 3137, the first area 3136, and the second area 3138 of the third transistor T3, and the channel 4137, the first area 4136, and the second area 4138 of the fourth transistor T4 may be connected to each other to be integrally formed. The first area 3136 and the second area 3138 of the third transistor T3 are disposed at respective sides of the channel 3137 of the third transistor T3, and the first area 4136 and the second area 4138 of the fourth transistor T4 are disposed at respective sides of the channel 4137 of the fourth transistor T4. The second area 3138 of the third transistor T3 is connected to the second area 4138 of the fourth transistor T4. The channel 3137 of the third transistor T3 overlaps the light blocking layer 3155, and the channel 4137 of the fourth transistor T4 overlaps the light blocking layer 4155.

The upper boost electrode 3138t of the boost capacitor $C_{boost}$ overlaps the lower boost electrode 151a of the boost capacitor $C_{boost}$ to form the boost capacitor $C_{boost}$.

A third gate insulation film 143 may be disposed on the oxide semiconductor layer including the channel 3137, the first area 3136, and the second area 3138 of the third transistor T3, and the channel 4137, the first area 4136, and the second area 4138 of the fourth transistor T4, and the upper boost electrode 3138t of the boost capacitor $C_{boost}$.

The third gate insulation film 143 may be disposed on an entire surface of the oxide semiconductor layer and the first interlayer insulation film 161. Therefore, the third gate insulation film 143 may cover upper and lateral surfaces of the channel 3137, the first area 3136, and the second area 3138 of the third transistor T3; of the channel 4137, the first area 4136, and the second area 4138 of the fourth transistor T4; and of the upper boost electrode 3138t of the boost capacitor $C_{boost}$. However, the present embodiment is not limited thereto, and the third gate insulation film 143 may not be disposed on the entire surface of the oxide semiconductor layer and the first interlayer insulation film 161. For example, the third gate insulation film 143 may overlap the channel 3137 of the third transistor T3, and it may not overlap the first area 3136 and the second area 3138 thereof. In addition, the third gate insulation film 143 may overlap the channel 4137 of the fourth transistor T4, and it may not overlap the first area 4136 and the second area 4138 thereof.

A third gate conductive layer including the gate electrode 3151 of the third transistor T3 and the gate electrode 4151 of the fourth transistor T4 may be disposed on the third gate insulation film 143.

The gate electrode 3151 of the third transistor T3 may overlap the channel 3137 of the third transistor T3. The gate electrode 3151 of the third transistor T3 may overlap the light blocking layer 3155 of the third transistor T3.

The gate electrode 4151 of the fourth transistor T4 may overlap the channel 4137 of the fourth transistor T4. The gate electrode 4151 of the fourth transistor T4 may overlap the light blocking layer 4155 of the fourth transistor T4.

The third gate conductive layer may further include an upper second scan line 152b and an upper initialization control line 153b.

The upper second scan line 152b and the upper initialization control line 153b may substantially extend in a horizontal direction. The upper second scan line 152b forms the second scan line 152 together with the lower second scan line 152a. The upper second scan line 152b may be connected to the gate electrode 3151 of the third transistor T3. The upper second scan line 152b may be integrally formed with the gate electrode 3151 of the third transistor T3. The upper initialization control line 153b forms the initialization control line 153 together with the lower initialization control line 153a. The upper initialization control line 153b may be connected to the gate electrode 4151 of the fourth transistor T4. The upper initialization control line 153b may be integrally formed with the gate electrode 4151 of the fourth transistor T4.

After the third gate conductive layer including the gate electrode 3151 of the third transistor T3 and the gate electrode 4151 of the fourth transistor T4 is formed, through a plasma treatment or doping process, a portion of the oxide semiconductor layer that is covered by the third gate conductive layer is formed as a channel, and a portion of the oxide semiconductor layer that is not covered by the third gate conductive layer is made conductive. The channel 3137 of the third transistor T3 may be disposed under the gate electrode 3151 to overlap the gate electrode 3151. The first area 3136 and the second area 3138 of the third transistor T3 may not overlap the gate electrode 3151. The channel 4137 of the fourth transistor T4 may be disposed under the gate electrode 4151 to overlap the gate electrode 4151. The first area 4136 and the second area 4138 of the fourth transistor T4 may not overlap the gate electrode 4151. The upper boost electrode 3138t may not overlap the third gate conductive layer. A transistor including an oxide semiconductor layer may have characteristics of an n-type transistor.

A second interlayer insulation film 162 may be disposed on the third gate conductive layer including the gate electrode 3151 of the third transistor T3 and the gate electrode 4151 of the fourth transistor T4. The second interlayer insulation film 162 may have a single layered or multi-layered structure. The second interlayer insulation film 162 may include an inorganic insulation material such as a silicon nitride (SiNx), a silicon oxide (SiOx), and a silicon oxynitride (SiOxNy), and in some embodiments, it may include an organic material. The second interlayer insulation film 162 may include a first opening 1165, a second opening 1166, a third opening 3165, and a fourth opening 3166.

The first opening 1165 may overlap at least a portion of the gate electrode 1151 of the driving transistor T1. The first opening 1165 may be formed in the third gate insulation film 143, the first interlayer insulation film 161, and the second gate insulation film 142. The first opening 1165 may overlap the opening 1152 of the first storage electrode 1153. The first opening 1165 may be disposed inside the opening 1152 of the first storage electrode 1153.

The second opening 1166 may overlap at least a portion of the boost capacitor Cboost. The second opening 1166 may be further formed in the third gate insulation film 143.

The third opening 3165 may overlap at least a portion of the second area 1133 of the driving transistor T1. The third opening 3165 may be further formed in the third gate insulation film 143, the first interlayer insulation film 161, the second gate insulation film 142, and the first gate insulation film 141.

The fourth opening 3166 may overlap at least a portion of the first area 3136 of the third transistor T3. The fourth opening 3166 may be further formed in the third gate insulation film 143.

A first data conductive layer including a first connection electrode 1175 and a second connection electrode 3175 may be disposed on the second interlayer insulation film 162.

The first connection electrode 1175 may overlap the gate electrode 1151 of the driving transistor T1. The first connection electrode 1175 may be connected to the gate electrode 1151 of the driving transistor T1 through the first opening 1165 and the opening 1152 of the first storage electrode 1153. The first connection electrode 1175 may overlap the boost capacitor Cboost. The first connection electrode 1175 may be connected to the upper boost electrode 3138t of the boost capacitor Cboost through the second opening 1166. Accordingly, the gate electrode 1151 of the driving transistor T1 and the upper boost electrode 3138t of the boost capacitor Cboost may be connected by the first connection electrode 1175. In this case, the gate electrode 1151 of the driving transistor T1 may be connected to the second area 3138 of the third transistor T3 and the second area 4138 of the fourth transistor T4 by the first connection electrode 1175.

The second connection electrode 3175 may overlap the second area 1133 of the driving transistor T1. The second connection electrode 3175 may be connected to the second area 1133 of the driving transistor T1 through the third opening 3165. The second connection electrode 3175 may overlap the first area 3136 of the third transistor T3. The second connection electrode 3175 may be connected to the first area 3136 of the third transistor T3 through the fourth opening 3166. Accordingly, the second area 1133 of the driving transistor T1 and the first area 3136 of the third transistor T3 may be connected by the second connection electrode 3175.

The first data conductive layer may further include the second initialization voltage line 128. The second initialization voltage line 128 may substantially extend in a horizontal direction.

A third interlayer insulation film 163 may be disposed on the first data conductive layer including the first connection electrode 1175 and the second connection electrode 3175. The third interlayer insulation film 163 may include an inorganic insulation material such as a silicon nitride (SiNx), a silicon oxide (SiOx), and a silicon oxynitride (SiOxNy), and in some embodiments, it may include an organic material.

A second data conductive layer including the data line 171 and the driving voltage line 172 may be disposed on the third interlayer insulation film 163. The data line 171 and the driving voltage line 172 may substantially extend in a vertical direction. The data line 171 may be connected to the second transistor T2. The driving voltage line 172 may be connected to the fifth transistor T5. In addition, the driving voltage line 172 may be connected to the first storage electrode 1153.

A passivation film 180 may be disposed on the data line 171 and the driving voltage line 172. The passivation film 180 may be made of an organic material.

Although not illustrated in FIG. 4 and FIG. 5, a pixel electrode and/or an anode may be disposed on the passivation film 180. A partition wall may be formed on the anode while overlapping one end of the anode. An opening formed in the partition wall exposes the anode, a light emitting element layer is formed within the opening, and then a cathode is formed on the partition wall and the light emitting element layer, thereby completing a light emitting diode (LED) including the anode, the light emitting element layer, and the cathode.

Although not shown, an encapsulation layer covering the cathode may be further included on the cathode.

In the structures of FIG. 4 and FIG. 5 as described above, the bottom shield layer BSL having the structure partially overlapping the gate electrode of the driving transistor T1 has been described.

According to the bottom shield layer BSL having the structure as shown in FIG. 4, the pixel is formed at a position corresponding to the opening FSA in the rear passivation layer 20, so that even when the light is transmitted from the outside, light is blocked by the bottom shield layer BSL disposed under the channel of the driving transistor T1. In addition, the light blocking layer 3155 of the third transistor T3 and the light blocking layer 4155 of the fourth transistor T4 are formed in the oxide semiconductor layer in which the channels of the third transistor T3 and the fourth transistor T4 are disposed, respectively, so that light is blocked and the characteristics thereof are not changed.

As a result, even if the pixel of the structure shown in FIG. 3 to FIG. 5 is formed on the display panel 100 corresponding to the opening FSA, the characteristics of the transistors (that is, the driving transistor T1, the third transistor T3, and the fourth transistor T4) included in the pixel are not changed.

However, even a bottom shield layer BSL having a structure different from that of FIG. 4 and FIG. 5 may provide the same or similar effects, and such a variation will be described with reference to FIG. 6 and FIG. 7.

Figure 6:
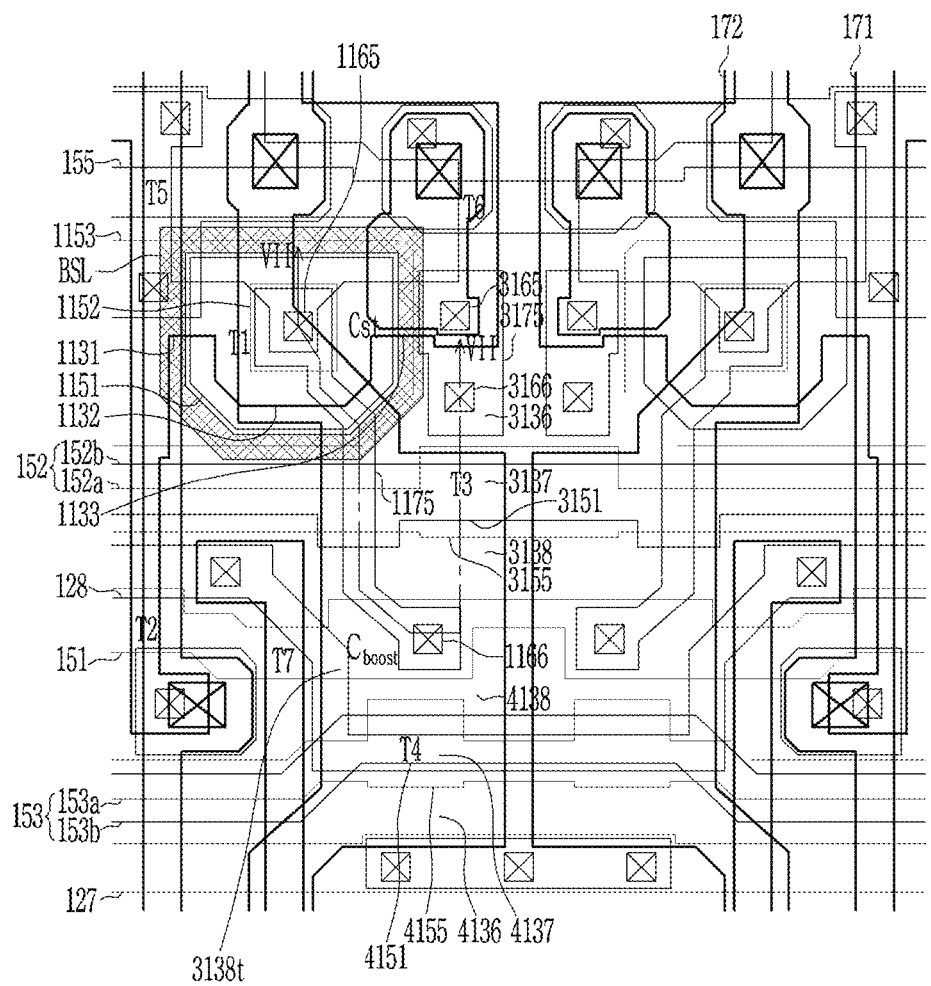
FIG. 6 illustrates a layout view of a pixel according to another embodiment.
Figure 7:
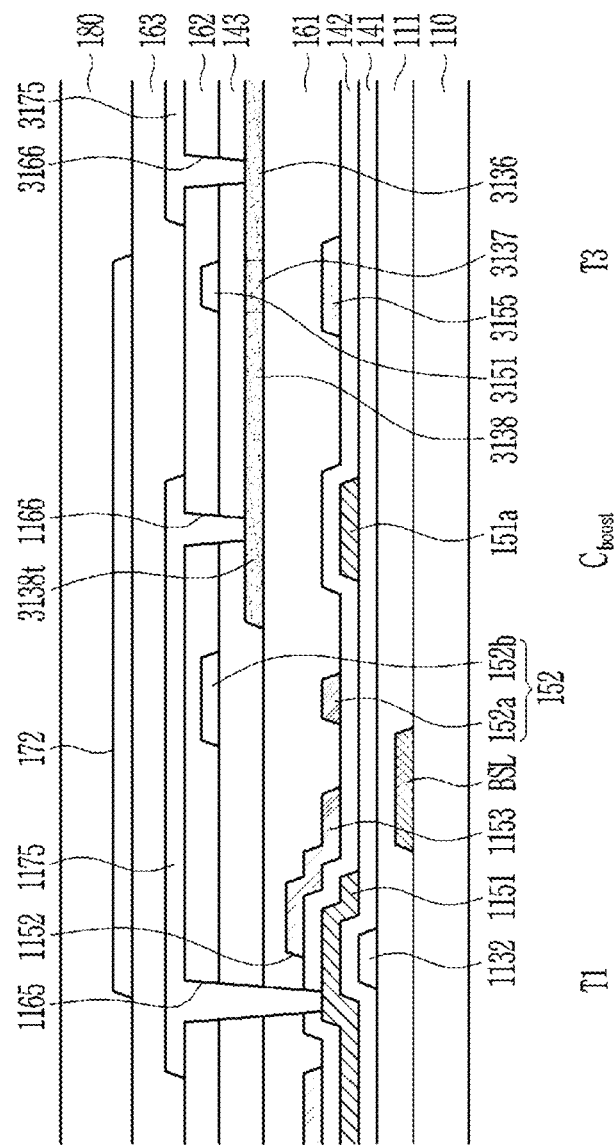
FIG. 7 illustrates a cross-sectional view taken along line VII-VII of FIG. 6.

FIG. 6 illustrates a layout view of a pixel according to another embodiment, and FIG. 7 illustrates a cross-sectional view taken along line VII-VII of FIG. 6.

The embodiment of FIG. 6 and FIG. 7 differs from the embodiment of FIG. 4 and FIG. 5 in that the bottom shield layer BSL does not overlap the gate electrode of the driving transistor T1.

That is, the bottom shield layer BSL is formed on the flexible substrate 110 to float around the gate electrode of the driving transistor T1. More specifically, the bottom shield layer BSL is formed to be spaced apart from the gate electrode of the driving transistor T1 by a predetermined distance in a plan view, and the bottom shield layer BSL is mainly formed between the driving transistor T1 and the fifth transistor T5 and between the driving transistor T1 and the sixth transistor T6. In addition, in order to block light incident on the channel of the driving transistor T1 from the side, in the embodiment of FIG. 4, the opening and the bottom shield layer BSL that surround the gate electrode of the driving transistor T1 and have an outline to be parallel to an outline of the gate electrode of the driving transistor T1 are shown.

Even with the bottom shield layer BSL having the structure shown in FIG. 6 and FIG. 7, it is possible to prevent change of the characteristic by preventing the light applied through the opening FSA from being incident on the channel of the driving transistor T1.

In the above, the effect of preventing light from being incident to the channel of the driving transistor T1 through the bottom shield layer BSL has been mainly described.

However, the embodiment, by using the flexible substrate, has an effect of preventing the channel of the driving transistor T1 from being affected by an electric field based on polarity arrangement of molecules generated in the substrate 110, which will be described in detail with reference to FIG. 8 to FIG. 10.

First, a cross-sectional structure of a display panel according to an embodiment will be described with reference to FIG. 8.

Figure 8:
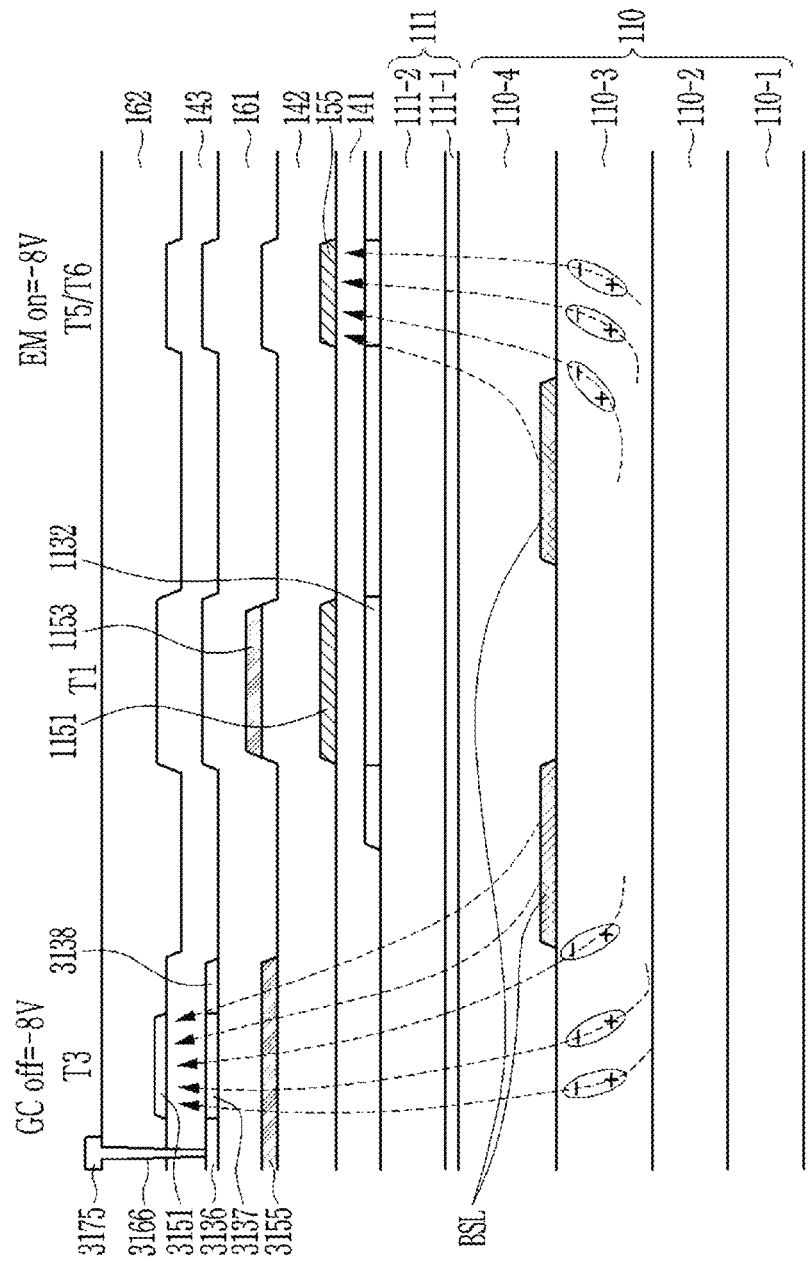
FIG. 8 illustrates a cross-sectional view of a pixel according to an embodiment.

FIG. 8 illustrates a cross-sectional view of a pixel according to an embodiment.

FIG. 8 illustrates a more detailed structure of the substrate 110 including a polyimide, and illustrates a cross-sectional structure of the driving transistor T1, the third transistor T3, and the fifth or sixth transistor T5 or T6.

First, the flexible substrate 110 including the polyimide includes two polyimide layers 110-1 and 110-3 and two barrier layers 110-2 and 110-4. Each of the barrier layers 110-2 and 110-4 is made of inorganic insulation materials such as a silicon nitride (SiNx), a silicon oxide (SiOx), and a silicon oxynitride (SiOxNy).

A double-layered buffer layer 111 is disposed on the upper barrier layer 110-4, one of a lower buffer layer 111-1 and an upper buffer layer 111-2 may be made of a silicon nitride (SiNx), and the other thereof may be made of a silicon oxide (SiOx).

In the embodiment of FIG. 8, unlike the embodiments of FIG. 5 and FIG. 7, the bottom shield layer BSL is not covered with the buffer layer 111, but is covered with the upper barrier layer 110-4, and is formed on the upper polyimide layer 110-3.

An upper structure of the buffer layer 111 is the same as those of FIG. 4 to FIG. 7, and the driving transistor T1 includes the channel 1132 of the polycrystalline semiconductor layer and the gate electrode 1151 thereon, and the storage capacitor Cst is formed by the first storage electrode 1153 overlapping the gate electrode 1151.

In addition, the fifth or sixth transistor T5 or T6 has a structure of having a channel in the polycrystalline semiconductor layer and including a gate electrode disposed on the emission control line 155.

Meanwhile, the third transistor T3 has the channel 3137 in the oxide semiconductor layer, and the first/second areas 3136 and 3138 at respective sides of the channel 3137. In addition, the third transistor T3 includes the gate electrode 3151 overlapping the channel 3137.

Additionally, the light blocking layer 3155 and the second connecting electrode 3175 may be included around the third transistor T3. The light blocking layer 3155 has a structure that overlaps the oxide semiconductor layer including the channel of the third transistor T3, and the second connection electrode 3175 is connected to the first area 3136 of the third transistor T3 through the fourth opening 3166.

In this structure, molecules (molecules such as of a polyimide) included in the upper polyimide layer 110-3 have a characteristic that they are arranged by an electric field.

In an emission period corresponding to a longest time among a period in which the pixel operates, since an on-voltage is applied as the emission control signal EM, a negative voltage of −8 V is applied, and the negative voltage of −8 V, which is an off-voltage, is applied as the second scan signal GC. As described above, the reason that the operation of the transistor is different with this same voltage is that each transistor is a different type, that is, an n-type or p-type.

Figure 9:
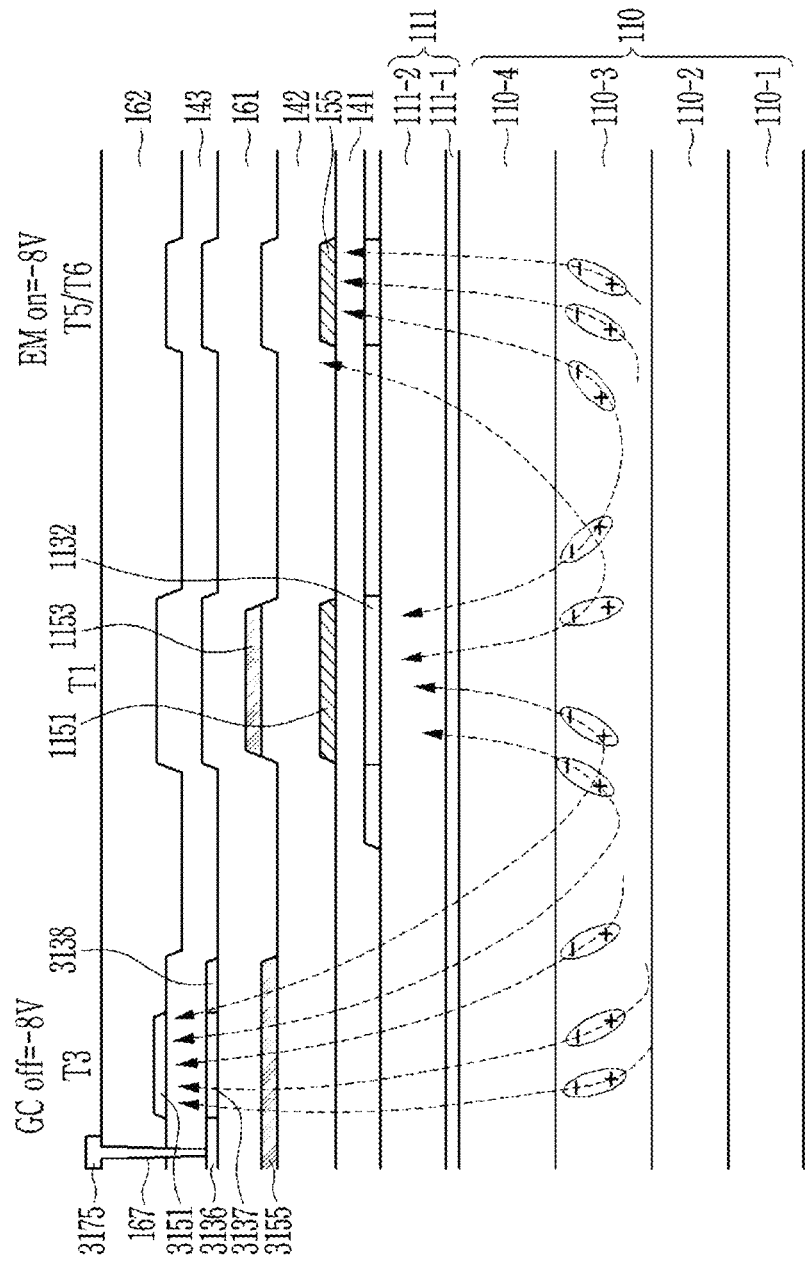
FIG. 9 illustrates a cross-sectional view of a pixel according to a comparative example.
Figure 10:
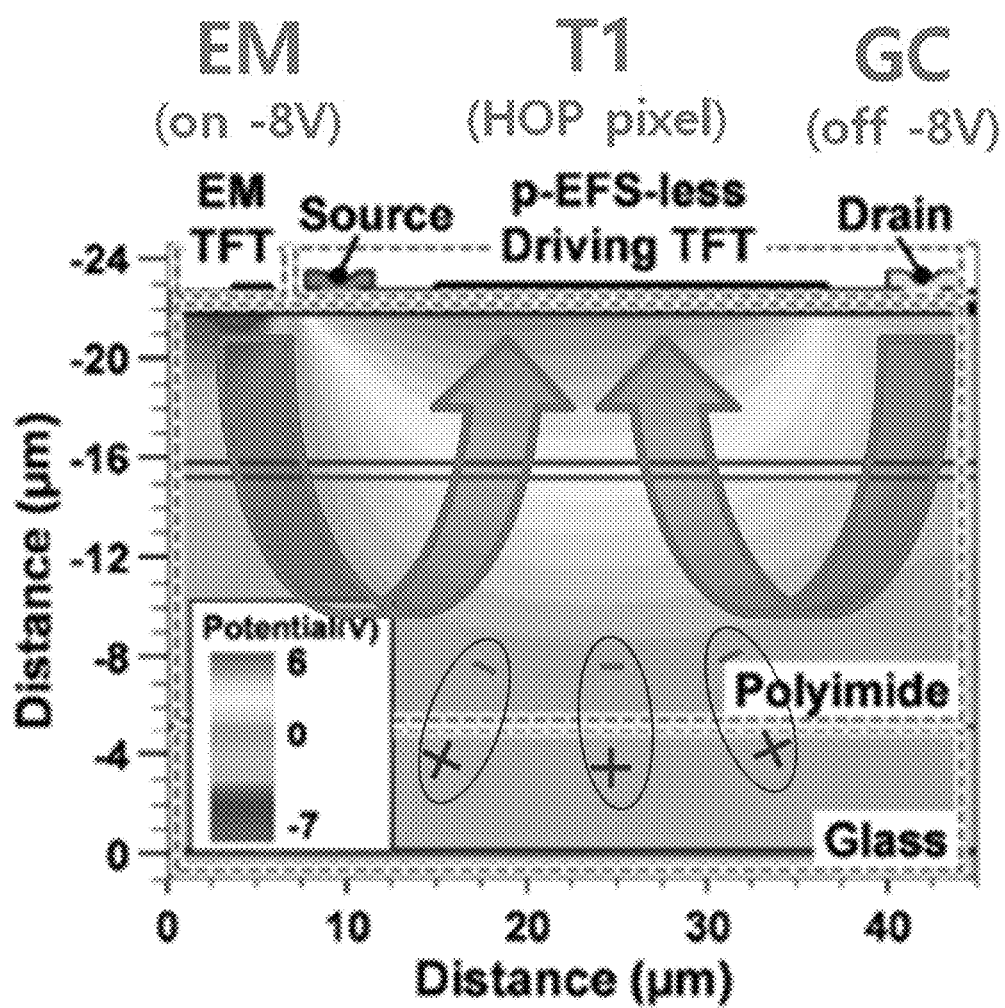
FIG. 10 and FIG. 11 illustrate electric field distributions of a pixel according to a comparative example.
Figure 11:
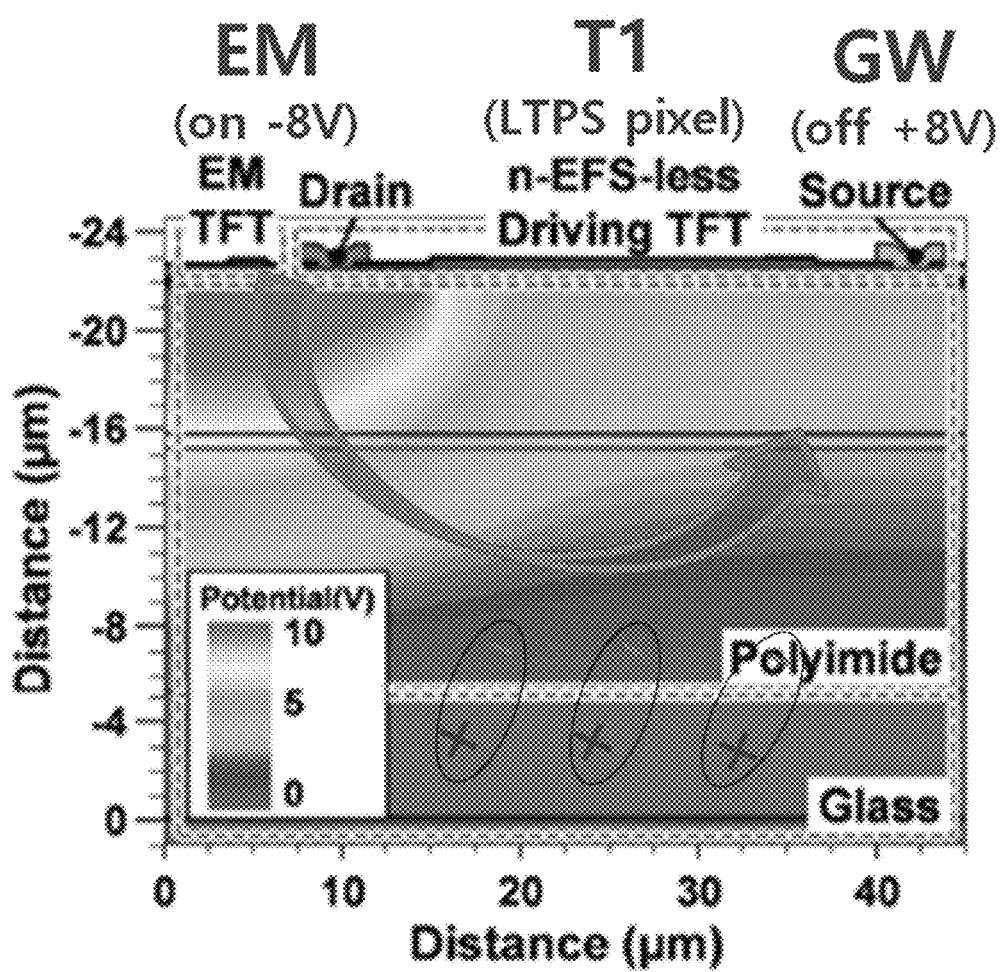

The present embodiment and a comparative example will be compared with respect to the electric field characteristic in the emission period with reference to FIG. 9 to FIG. 11.

FIG. 9 illustrates a cross-sectional view of a pixel according to a comparative example, and FIG. 10 and FIG. 11 illustrate electric field distributions of a pixel according to a comparative example.

First, a comparative example of FIG. 9 is a structure without the bottom shield layer BSL as compared with the embodiment of FIG. 8.

In FIG. 9, it can be seen that as the molecules are arranged in the upper polyimide layer 110-3 due to the negative voltage applied to the third transistor T3 and the negative voltage applied to the fifth or sixth transistor T5 or T6, the electric field is concentrated under the driving transistor T1. This is because a strong negative voltage is positioned at both sides, so that a relatively positive polarity should be caused therebetween, and the caused positive polarity is formed around a surface of the upper polyimide layer 110-3.

In contrast, in the present embodiment of FIG. 8, the bottom shield layer BLS is disposed on the surface of the upper polyimide layer 110-3, so that charges of the positive polarity caused on the surface of the upper polyimide layer 110-3 are shielded by the bottom shield layer BSL to not affect the channel of the driving transistor T1. As a result, the characteristic of the driving transistor T1 is not changed.

In FIG. 10 and FIG. 11, a pixel (HOP pixel) using two types of semiconductor layers (polycrystalline semiconductor layer and oxide semiconductor layer) (FIG. 10) and a pixel (LTPS pixel) using only a polycrystalline semiconductor layer as a semiconductor layer are compared and illustrated.

That is, FIG. 10 shows that when two different types of semiconductor layers are used, as in FIG. 9, a voltage allowing one transistor to be turned on and a voltage allowing the other transistor to be turned off are the same, so that the electric field is concentrated on the driving transistor T1 disposed therebetween.

However, in the comparative example of FIG. 11 using only one polycrystalline semiconductor, it can be seen that since a voltage turning on one transistor and a voltage turning off the other transistor are different from each other, the electric field is applied from one side to the other side, and thus there is little effect on the characteristics of the driving transistor T1.

Therefore, in order to form the opening FSA in the rear surface of the pixel that uses the structure in which the polycrystalline semiconductor layer and the oxide semiconductor layer are formed in one pixel, for fingerprint sensing and the like, it can be seen that it is necessary to form the bottom shield layer BSL in an area overlapping the opening FSA in a plan view due to light applied through the opening FSA and in pixels disposed around the area.

Hereinafter, a modified embodiment of the bottom shield layer BSL will be described through FIG. 12 to FIG. 15.

Figure 12:
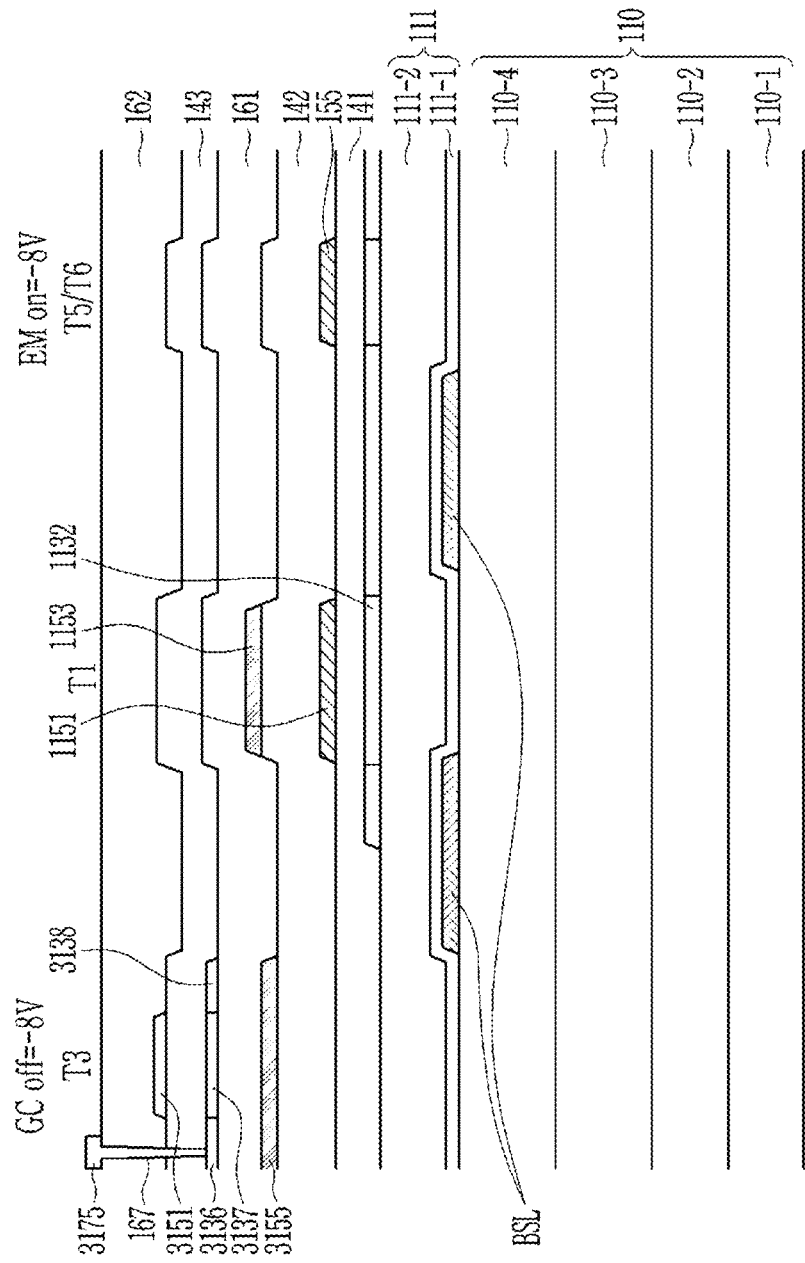
FIG. 12 and FIG. 13 illustrate cross-sectional views of a pixel according to another embodiment.
Figure 13:
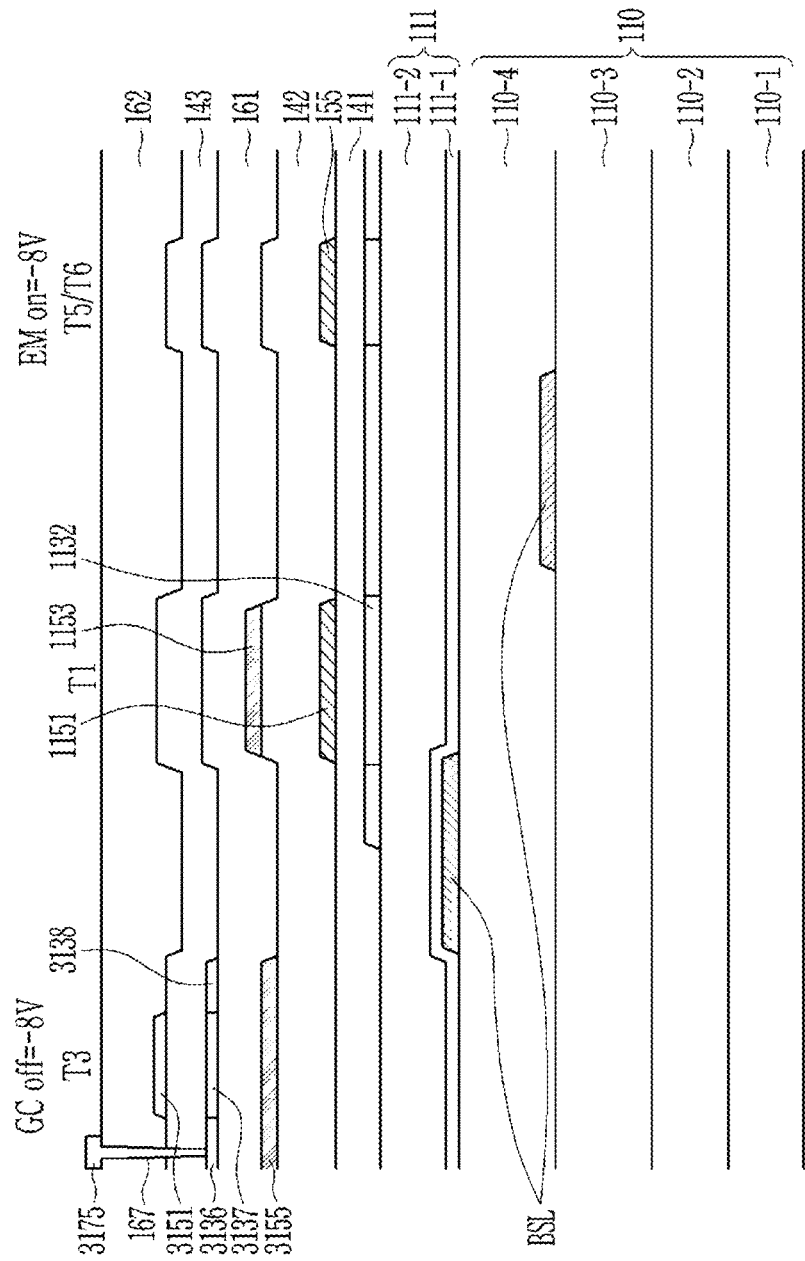
Figure 14:
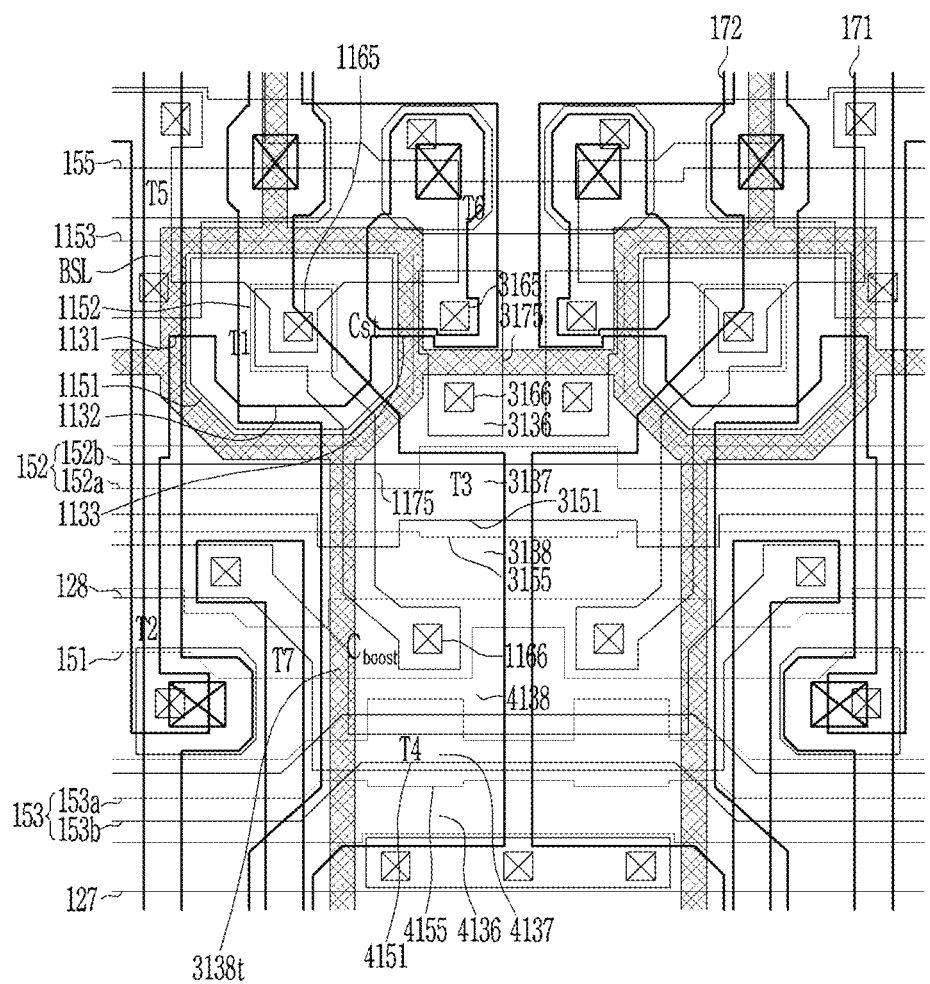
FIG. 14 illustrates a layout view of a pixel according to another embodiment.

FIG. 12 and FIG. 13 illustrate cross-sectional views of a pixel according to another embodiment, and FIG. 14 illustrates a layout view of a pixel according to another embodiment.

First, a bottom shield layer BSL formed at a layer position that is different from that of FIG. 8 will be described through FIG. 12 and FIG. 13.

In FIG. 8, the structure in which the bottom shield layer BSL is formed on the upper polyimide layer 110-3 and is covered by the upper barrier layer 110-4 has been described.

In contrast, FIG. 12 illustrates an embodiment in which the bottom shield layer BSL is disposed on the upper barrier layer 110-4 and is covered by the buffer layer 111, specifically, the lower buffer layer 111-1. However, in some embodiments, the bottom shield layer BSL may be formed on the lower buffer layer 111-1, and may be covered by the upper buffer layer 111-2.

Meanwhile, in the embodiment of FIG. 13, two bottom shield layers BSL (first bottom shield layer and second bottom shield layer) disposed around the channel of the driving transistor T1 are formed, and one thereof is formed on the upper polyimide layer 110-3 and is covered by the upper barrier layer 110-4, and the other thereof is disposed on the upper barrier layer 110-4 and is covered by the buffer layer 111. The two bottom shield layers BSL shown in FIG. 13 may have a structure in which at least some areas overlap each other, and may have different shapes or the same shape.

Meanwhile, hereinafter, a change in a planar structure will be described through FIG. 14.

Unlike FIG. 4 and FIG. 6, FIG. 14 has a structure that further includes extensions extending in four directions from the bottom shield layer BSL, and has a structure that does not overlap the gate electrode of the driving transistor T1 as shown in FIG. 6. However, in a further modified embodiment, the bottom shield layer BSL may partially overlap the gate electrode of the driving transistor T1.

The bottom shield layer BSL may be floating, but in the structure shown in FIG. 14, an extension connected to the bottom shield layer BSL formed in adjacent pixels is formed, so that the bottom shield layer BSL is not floating, and it may be applied with a voltage of a constant level (for example, the driving voltage ELVDD).

In the above, the case in which the pixel is disposed in and around the opening FSA of the rear passivation layer 20 in which a sensor such as a fingerprint sensor is disposed in the display panel 100 in a plan view, has been mainly described.

Figure 15:
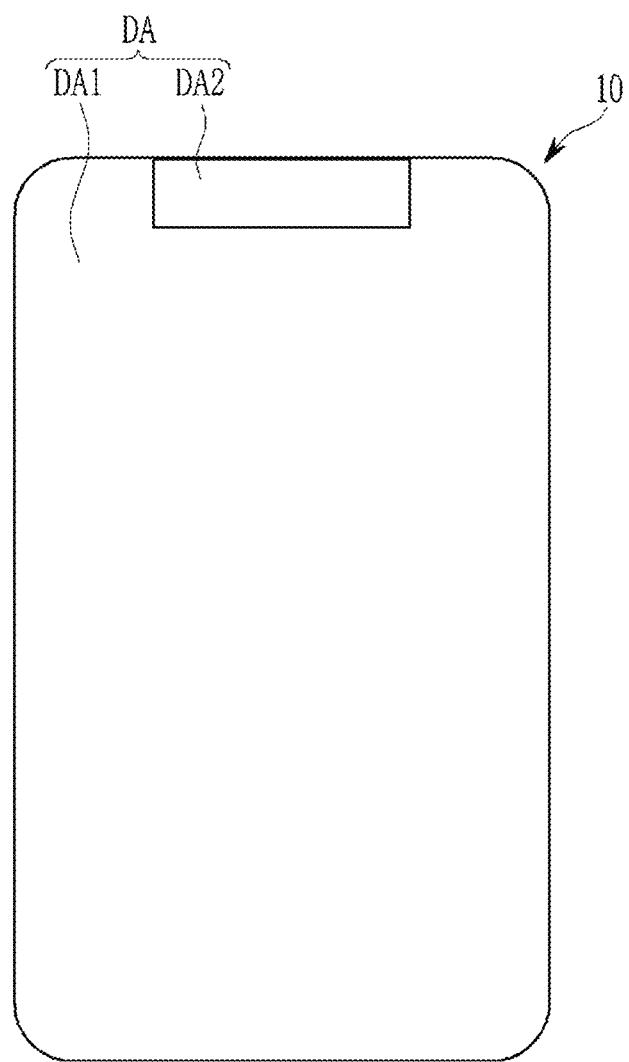
FIG. 15 illustrates a schematic top plan view of a display device according to another embodiment.

However, in some embodiments, it may be disposed in the second display area DA2 in which a camera is positioned as shown in FIG. 15. Hereinafter, a second display area DA2 will be described through FIG. 15 to FIG. 17.

Figure 16:
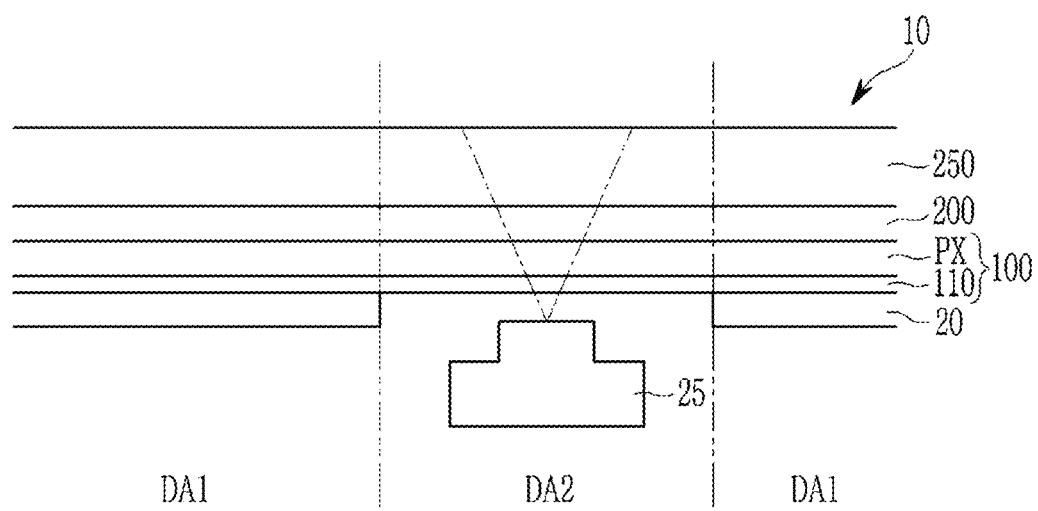
FIG. 16 illustrates a schematic cross-sectional view of a portion of the display device of FIG. 15.
Figure 17:
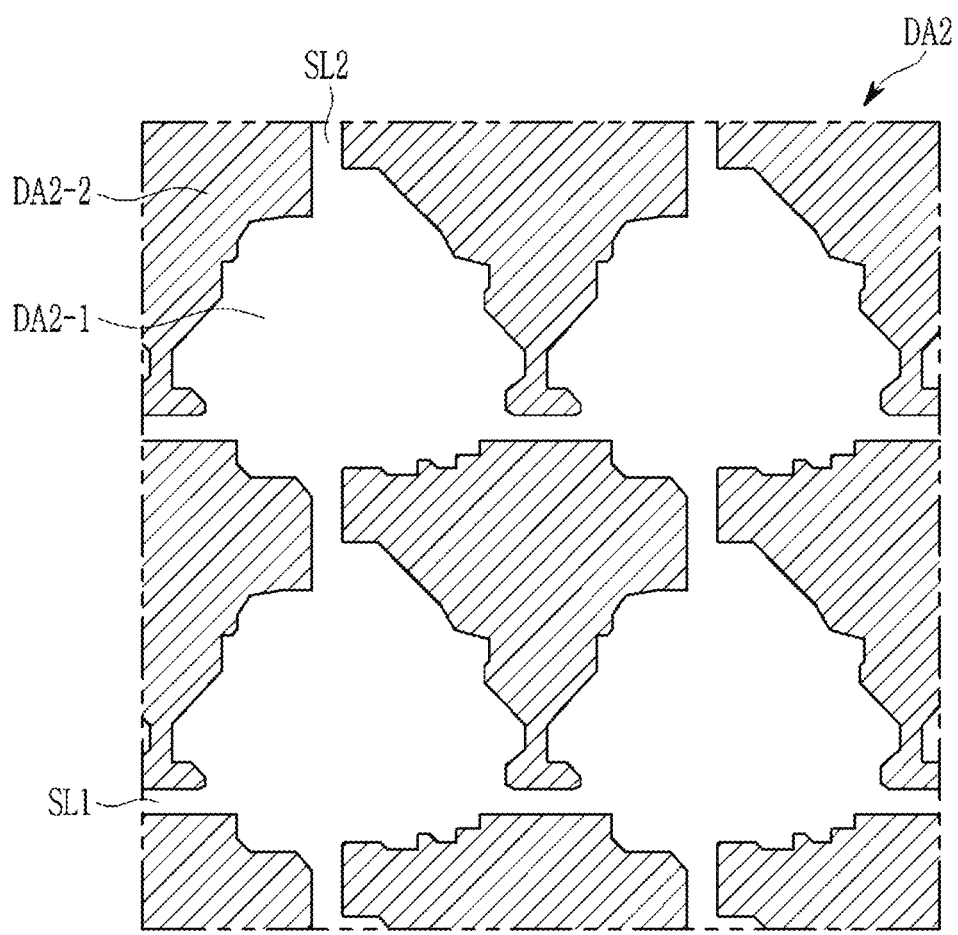
FIG. 17 illustrates an enlarged top plan view of a second display area of FIG. 15.

FIG. 15 illustrates a schematic top plan view of a display device according to another embodiment, FIG. 16 illustrates a schematic cross-sectional view of a portion of the display device of FIG. 15, and FIG. 17 illustrates an enlarged top plan view of a second display area of FIG. 15.

The display device 10 according to the present embodiment includes the display panel 100, and the display panel 100 includes a display area DA including a plurality of pixels PX to display an image, while the display area DA includes a first display area DA1 and a second display area DA2. A non-display area may be disposed outside the display area DA.

The first display area DA1 is an area in which the plurality of pixels PX are continuously arranged for displaying an image, the pixel circuit part of the pixel PX may be continuously arranged along rows and columns, and the light emitting elements may be arranged in various ways. The first display area DA1 mainly displays an image, and may include a touch sensing electrode at an upper side thereof to sense a touch.

The second display area DA2 additionally serves to transmit light so that an optical element 25 disposed on the rear surface of the display panel 100 may operate, in addition to its own function of displaying an image. That is, the second display area DA2 is an area in which an empty space (transmissive area DA2-2) in which no pixel PX is formed is further formed between the plurality of pixels PX. As a result, in addition to the unique function of displaying an image by a pixel area DA2-1, the second display area DA2 may perform another function by using the optical element 25 such as a camera or infrared sensor disposed on the rear surface by using the transmission area DA2-2. The second display area DA2 has higher transmittance than the first display area DA1 by the transmission area DA2-2. The second display area DA2 has a density of the pixels PX, that is, the number of pixels PX per unit area, which is smaller than that of the first display area DA1, and has a lower resolution of the displayed image than that of the first display area DAL The second display area DA2 may also sense a touch by including a touch sensing electrode at an upper side thereof.

The shape, position, and size of the second display area DA2 in the display area DA may be variously changed. That is, unlike the shape of the second display area DA2 shown in FIG. 15, it may have various polygonal shapes such as a circular shape. In addition, a portion of the entire display area DA in which the second display area DA2 is disposed may be disposed to be close to an outer periphery of the display area DA or disposed to be close to a center thereof. A plurality of second display areas DA2 may be included, and an extending direction thereof may be a vertical direction, unlike that of FIG. 15.

Referring to FIG. 15, since the second display area DA2 is disposed at one side of the first display area DA1, the first display area DA1 is not disposed at an upper portion of the second display area DA2, but in some embodiment, the second display area DA2 may be surrounded by the first display area DA1.

Referring to FIG. 16, the display device 10 may include a display panel 100, and a rear passivation layer 20 disposed on a rear surface thereof, a touch sensing part 200 disposed on an upper surface thereof, and a window 250.

The rear passivation layer 20 may include a black tape 11, a cushion layer 12, and a metal layer 13, as shown in FIG. 2, and includes an opening corresponding to the light element 25. The opening of the rear passivation layer 20 corresponds to the second display area DA2.

FIG. 16 illustrates that the window 250 and the touch sensing part 200 are disposed on the upper portion of the display panel 100, but the window 250 and the touch sensing part 200 may be additionally included in FIG. 2.

FIG. 16 briefly illustrates that various elements of the pixel PX are formed on the flexible substrate 110 of the display panel 100. The pixel PX of the display panel 100 may be covered by an encapsulation layer to be sealed to prevent moisture or air from penetrating from the outside.

Referring to FIG. 17, the second display area DA2 includes the pixel area DA2-1 and the transmission area DA2-2, and the transmission area DA2-2 may be separated and partitioned by wires SL1 and SL2 connected to each other by the pixel area DA2-1.

The transmission area DA2-2 has high transmittance so that light may be provided to the optical element 25 disposed on the rear surface, and a pixel having the structure as shown in FIG. 3 to FIG. 8, FIG. 12 to FIG. 14, and FIG. 18 may be formed in the pixel area DA2-1. The resolution of the second display area DA2 may be degraded due to the transmission area DA2-2.

A polarizer may be attached to the upper surface of the display panel 100, or a color filter layer or a color conversion layer may be further formed thereon together with a black matrix. These constituent elements may serve to prevent external light from being reflected and thus prevent the upper pattern of the pixel from being viewed by a user's eye. In addition, the color filter layer or the color conversion layer may be used to improve displayed color.

For example, the optical elements 25 may include a sensor, a camera, and a flash. When the optical element 25 is a sensor, the optical element 25 may be a proximity sensor, an illuminance sensor, an infrared sensor, or an ultraviolet sensor.

Hereinafter, shapes of various bottom shield layers will be described through FIG. 18.

FIG. 18 illustrates shapes of various bottom shield layers according to an embodiment.

Figure 18A:
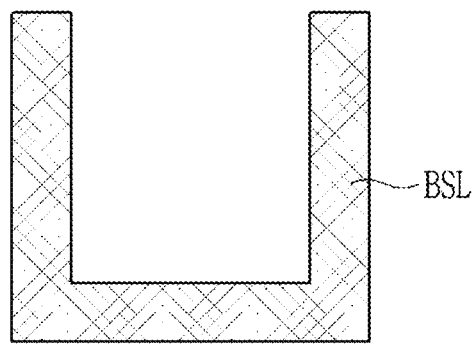
FIG. 18A to FIG. 18C illustrates shapes of various bottom shield layers according to an embodiment.
Figure 18B:
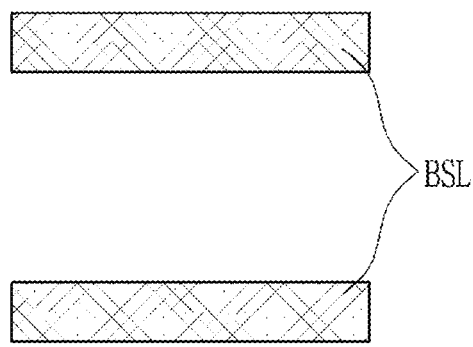
Figure 18C:
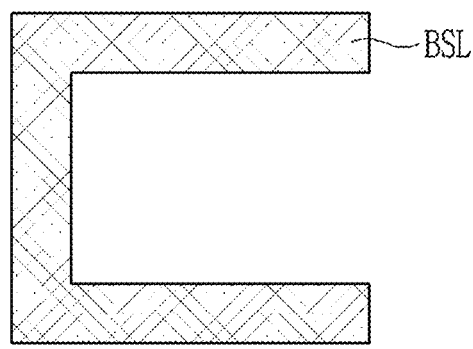

FIG. 18A illustrates the bottom shield layer BSL including an upper portion that is opened, FIG. 18B illustrates the bottom shield layer BSL including both sides that are opened, and FIG. 18C illustrates the bottom shield layer BSL including one side that is opened. Although not shown in FIG. 18, a structure in which a lower portion thereof is opened or a left side thereof is opened may also be used.

In addition, in FIG. 18B, the bottom shield layer BSL having a linear structure is respectively formed at upper and lower sides of the channel of the driving transistor T1, but through modification, the bottom shield layer BSL having a linear structure may be formed only at one side of the upper and lower sides.

Since the bottom shield layer BSL is formed for some pixels near each other, unnecessary parasitic capacitance may occur when the bottom shield layer BSL having a large area is formed, and thus it is necessary to optimize the position and area of the bottom shield layer BSL. In this case, a pixel including an optimized bottom shield layer BSL may be formed by selecting one of the various structures shown in FIG. 18.

While this disclosure has been described in connection with what is presently considered to be practical embodiments, it is to be understood that the invention is not limited to the disclosed embodiments, but, on the contrary, is intended to cover various modifications and equivalent arrangements included within the spirit and scope of the appended claims.

What is claimed is:

1. A display device comprising:
a flexible substrate including a polyimide layer, and a barrier layer disposed on the polyimide layer;
a driving transistor and a second transistor disposed on the flexible substrate and including a polycrystalline semiconductor layer;
a third transistor disposed on the flexible substrate and including an oxide semiconductor layer;
a light emitting diode electrically connected to the driving transistor; and
a bottom shield layer disposed between the polyimide layer and the polycrystalline semiconductor layer in a cross-sectional view and disposed around a channel of the driving transistor in a plan view,
wherein a middle portion of the bottom shield layer includes an opening, and the barrier layer contacts the polyimide layer through the opening.

2. The display device of claim 1, wherein
the opening of the bottom shield layer has at least one side that is open.

3. The display device of claim 1, wherein
the bottom shield layer includes an extension connected to an adjacent bottom shield layer.

4. The display device of claim 1, wherein
the driving transistor further includes a gate electrode, and the gate electrode of the driving transistor partially overlaps the bottom shield layer in a plan view.

5. The display device of claim 1, wherein
the driving transistor further includes a gate electrode, and the gate electrode of the driving transistor does not overlap the bottom shield layer in a plan view.

6. The display device of claim 1, further comprising
a buffer layer disposed between the substrate and the polycrystalline semiconductor layer,
wherein the bottom shield layer is disposed on the substrate and is covered with the buffer layer.

7. The display device of claim 6, wherein
the bottom shield layer further includes a second bottom shield layer that is disposed on the polyimide layer and is covered by the barrier layer.

8. The display device of claim 1, wherein
the bottom shield layer is disposed on the polyimide layer and is covered by the barrier layer.

9. The display device of claim 1, wherein
the substrate includes a second polyimide layer and a second barrier layer.

10. The display device of claim 1, further comprising
a rear passivation layer disposed on a rear surface of the flexible substrate and including an opening,
wherein one pixel including the driving transistor, the second transistor, the third transistor, the light emitting diode, and the bottom shield layer is formed at a position corresponding to the opening of the rear passivation layer on the flexible substrate.

11. The display device of claim 10, further comprising
a fingerprint sensing sensor disposed in the opening of the rear passivation layer.

12. The display device of claim 10, further comprising
a camera or an optical element disposed in the opening of the rear passivation layer.

13. A display device comprising:
a substrate including a polyimide layer and a barrier layer;
a polycrystalline semiconductor layer disposed on the substrate and including a channel of a driving transistor;
a first gate insulation film disposed on the polycrystalline semiconductor layer;
a gate electrode of the driving transistor that is disposed on the first gate insulation film and overlaps the channel of the driving transistor;
a first electrode of a boost capacitor disposed on the first gate insulation film;
a second gate insulation film disposed on the gate electrode of the driving transistor and the first electrode of the boost capacitor;
a first interlayer insulation film disposed on the second gate insulation film;
an oxide semiconductor disposed on the first interlayer insulation film and including a channel of a third transistor, a channel of a fourth transistor, and a second electrode of the boost capacitor;
a third gate insulation film disposed on the oxide semiconductor;
a gate electrode of the third transistor disposed on the third gate insulation film and overlapping the channel of the third transistor;
a gate electrode of the fourth transistor disposed on the third gate insulation film and overlapping the channel of the fourth transistor;
a second interlayer insulation film disposed on the gate electrode of the third transistor and the gate electrode of the fourth transistor; and
a bottom shield layer disposed between the polyimide layer and the polycrystalline semiconductor layer.

14. The display device of claim 13, wherein
the gate electrode of the driving transistor partially overlaps the bottom shield layer in a plan view.

15. The display device of claim 13, wherein
the gate electrode of the driving transistor does not overlap the bottom shield layer in a plan view.

16. The display device of claim 13, further comprising
a buffer layer disposed between the substrate and the polycrystalline semiconductor layer, wherein the bottom shield layer is disposed on the substrate and is covered with the buffer layer.

17. The display device of claim 16, wherein the bottom shield layer further includes a second bottom shield layer that is disposed on the polyimide layer and is covered by the barrier layer.

18. The display device of claim 13, wherein the bottom shield layer is disposed on the polyimide layer and is covered by the barrier layer.

19. The display device of claim 13, wherein the substrate includes a second polyimide layer and a second barrier layer.

20. The display device of claim 13, further comprising a rear passivation layer disposed on a rear surface of the substrate and including an opening,
wherein one pixel including the driving transistor, the third transistor, the fourth transistor, the boost capacitor, and the bottom shield layer is formed at a position corresponding to the opening of the rear passivation layer on the substrate.

* * * * *